US010170600B2

(12) United States Patent
Jinbo

(10) Patent No.: US 10,170,600 B2
(45) Date of Patent: Jan. 1, 2019

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Yasuhiro Jinbo, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/860,001

(22) Filed: Jan. 2, 2018

(65) Prior Publication Data
US 2018/0197975 A1 Jul. 12, 2018

(30) Foreign Application Priority Data

Jan. 12, 2017 (JP) .................................. 2017-003050

(51) Int. Cl.
*H01L 21/00* (2006.01)
*H01L 21/16* (2006.01)
*H01L 29/66* (2006.01)
*H01L 21/78* (2006.01)
*H01L 27/32* (2006.01)
*H01L 51/00* (2006.01)

(52) U.S. Cl.
CPC .... *H01L 29/66969* (2013.01); *H01L 21/7806* (2013.01); *H01L 27/3244* (2013.01); *H01L 51/0097* (2013.01); *H01L 2227/323* (2013.01)

(58) Field of Classification Search
CPC ............. H01L 21/7806; H01L 27/3244; H01L 29/66969; H01L 51/0097

USPC ......................................................... 438/104
See application file for complete search history.

(56) References Cited

U.S. PATENT DOCUMENTS

| | | | |
|---|---|---|---|
| 5,917,221 A | 6/1999 | Takemura | |
| 6,198,133 B1 | 3/2001 | Yamazaki et al. | |
| 7,288,480 B2 | 10/2007 | Yamaguchi et al. | |
| 7,485,511 B2 | 2/2009 | Yamada et al. | |
| 8,664,658 B2 | 3/2014 | Yoneda | |

(Continued)

FOREIGN PATENT DOCUMENTS

JP      2015-223823 A     12/2015

OTHER PUBLICATIONS

Yoon.J et al., "World 1st Large Size 18-inch Flexible OLED Display and the Key Technologies", SID Digest '15 : SID International Symposium Digest of Technical Papers, Jun. 2, 2015, pp. 962-965.

*Primary Examiner* — David S Blum
(74) *Attorney, Agent, or Firm* — Robinson Intellectual Property Law Office; Eric J. Robinson

(57) ABSTRACT

A manufacturing method of a semiconductor device including a step of forming a silicon layer over a formation substrate, a step of forming a resin layer over the silicon layer, a step of forming a transistor over the resin layer, a step of forming a conductive layer over the silicon layer and the resin layer, and a step of separating the formation substrate and the transistor. The resin layer has an opening over the silicon layer. The conductive layer is in contact with the silicon layer through the opening in the resin layer. In the step of separating the formation substrate and the transistor, the silicon layer is irradiated with light, so that silicon contained in the silicon layer reacts with a metal contained in the conductive layer, and a metal silicide layer is formed.

11 Claims, 14 Drawing Sheets

(56) References Cited

U.S. PATENT DOCUMENTS

| | | | |
|---|---|---|---|
| 8,956,891 B2 | 2/2015 | Chida | |
| 9,437,831 B2 | 9/2016 | Yamazaki et al. | |
| 9,559,316 B2 | 1/2017 | Yamazaki et al. | |
| 9,559,317 B2 | 1/2017 | Yamazaki et al. | |
| 2014/0339517 A1 | 11/2014 | Park et al. | |
| 2014/0346473 A1 | 11/2014 | Park et al. | |
| 2016/0283028 A1 | 9/2016 | Yamazaki et al. | |
| 2016/0299387 A1 | 10/2016 | Yamazaki et al. | |
| 2016/0358986 A1 | 12/2016 | Yamazaki et al. | |
| 2017/0031192 A1 | 2/2017 | Yamazaki et al. | |
| 2017/0031471 A1 | 2/2017 | Yamazaki et al. | |
| 2017/0033172 A1 | 2/2017 | Yamazaki et al. | |
| 2017/0133450 A1 | 5/2017 | Yamazaki et al. | |
| 2017/0278878 A1* | 9/2017 | Kuwabara | H01L 21/67092 |
| 2017/0294462 A1 | 10/2017 | Yamazaki et al. | |
| 2017/0338250 A1 | 11/2017 | Yanaka et al. | |
| 2018/0061638 A1* | 3/2018 | Yamazaki | H01L 21/02345 |
| 2018/0061639 A1* | 3/2018 | Yamazaki | H01L 21/02002 |
| 2018/0085859 A1* | 3/2018 | Yamazaki | B23K 26/57 |

* cited by examiner

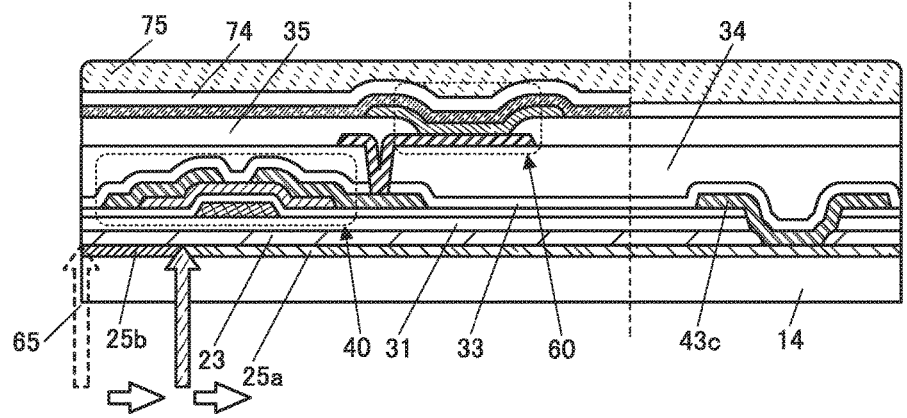
FIG. 4A
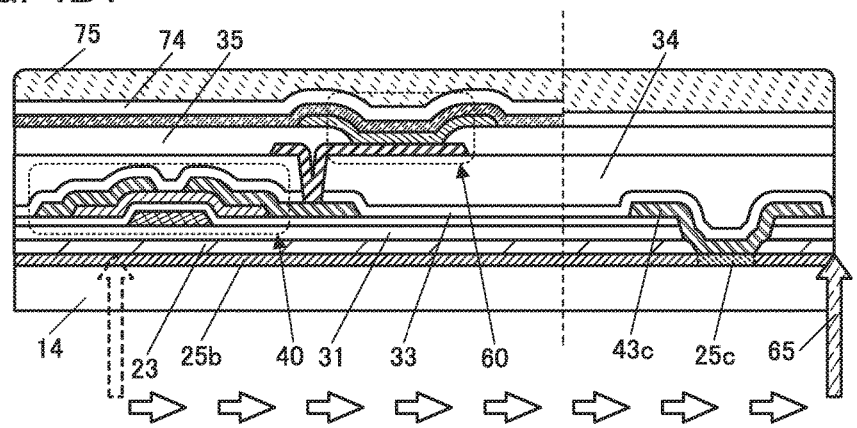
FIG. 4B1
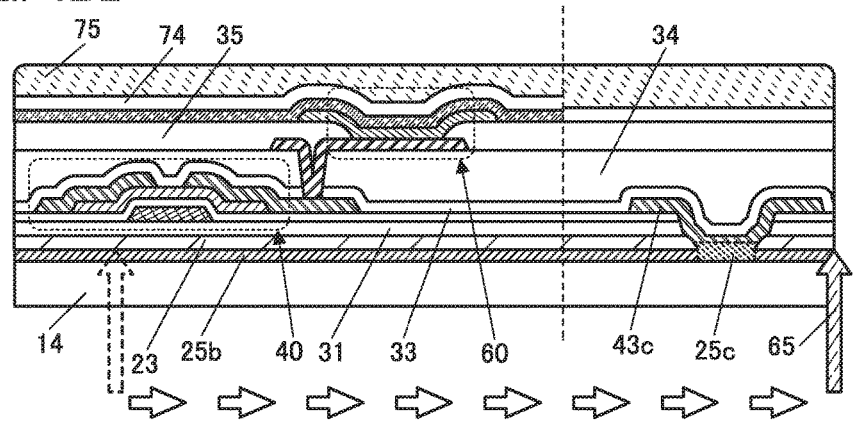
FIG. 4B2

METHOD FOR MANUFACTURING SEMICONDUCTOR DEVICE

BACKGROUND OF THE INVENTION

1. Field of the Invention

One embodiment of the present invention relates to a separation method. One embodiment of the present invention relates to a method for manufacturing a device including a separation step. One embodiment of the present invention relates to a semiconductor device, a display device, and a manufacturing method thereof.

Note that one embodiment of the present invention is not limited to the above technical field. Examples of the technical field of one embodiment of the present invention include a semiconductor device, a display device, a light-emitting device, an electronic device, a lighting device, an input device (e.g., a touch sensor), an input-output device (e.g., a touch panel), a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

2. Description of the Related Art

Display devices using organic electroluminescent (EL) elements or liquid crystal elements have been known. In addition, examples of the display device include a light-emitting device including a light-emitting element such as a light-emitting diode (LED), and an electronic paper performing display by an electrophoretic method or the like.

The organic EL element generally has a structure in which a layer containing a light-emitting organic compound is provided between a pair of electrodes. By voltage application to this element, the light-emitting organic compound can emit light. With use of such an organic EL element, thin, lightweight, high-contrast, and low-power-consumption display devices can be achieved.

Furthermore, by forming a semiconductor element such as a transistor and a display element such as the organic EL element over a flexible substrate (film), a flexible display device can be provided.

Patent Document 1 discloses a method for manufacturing a flexible display device by separating a heat-resistant resin layer from a glass substrate after a supporting substrate (a glass substrate) provided with a heat-resistant resin layer and electronic elements is irradiated with laser light through a sacrificial layer.

REFERENCE

Patent Document

[Patent Document 1] Japanese Published Patent Application No. 2015-223823

SUMMARY OF THE INVENTION

An object of one embodiment of the present invention is to provide a novel separation method, a novel manufacturing method of a semiconductor device, or a novel manufacturing method of a display device. Another object of one embodiment of the present invention is to provide a separation method, a manufacturing method of a semiconductor device, or a manufacturing method of a display device each having a low cost and a high productivity. Another object of one embodiment of the present invention is to simplify a manufacturing process of a semiconductor device or a display device. Another object of one embodiment of the present invention is to manufacture a semiconductor device or a display device using a large-sized substrate. Another object of one embodiment of the present invention is to provide a highly reliable semiconductor device or a display device. Another object of one embodiment of the present invention is to manufacture a semiconductor device or a display device at low temperatures.

An object of one embodiment of the present invention is to provide a highly reliable display device. An object of one embodiment of the present invention is to reduce the thickness or weight of a display device. An object of one embodiment of the present invention is to provide a flexible display device or a display device having a curved surface.

Note that the descriptions of these objects do not disturb the existence of other objects. Note that one embodiment of the present invention does not necessarily achieve all the objects. Other objects can be derived from the description of the specification, the drawings, and the claims.

One embodiment of the present invention is a manufacturing method of a semiconductor device including the steps of forming a silicon layer over a formation substrate, forming a resin layer over the silicon layer, forming a transistor over the resin layer, forming a conductive layer over the silicon layer and the resin layer, and separating the formation substrate and the transistor from each other. The resin layer includes an opening over the silicon layer. The conductive layer is in contact with the silicon layer through the opening of the resin layer. In the step of separating the formation substrate and the transistor from each other, silicon contained in the silicon layer and metal contained in the conductive layer react with each other by irradiation of the silicon layer with light to form a metal silicide layer.

The conductive layer preferably includes one or more of nickel, cobalt, molybdenum, titanium, tungsten, vanadium, niobium, rhenium, palladium, platinum, erbium, and magnesium.

The conductive layer is preferably formed using the same material and the same step as a material and a step used for an electrode included in the transistor.

The light preferably has a wavelength range of greater than or equal to 180 nm and less than or equal to 450 nm.

The silicon layer preferably contains hydrogen. The silicon layer preferably releases the hydrogen by being irradiated with the light in the step of separating the formation substrate and the transistor from each other.

A hydrogenated amorphous silicon layer is preferably formed as the silicon layer.

The silicon layer is preferably irradiated with the light with a linear laser.

The resin layer preferably has a thickness of greater than or equal to 0.1 μm and less than or equal to 5 μm.

The silicon layer is preferably irradiated with the light from the formation substrate side.

The transistor preferably includes a metal oxide in a channel formation region.

The metal silicide layer is preferably exposed in the step of separating the formation substrate and the transistor from each other. The exposed metal silicide layer and a circuit board are preferably electrically connected to each other after the step of separating the formation substrate and the transistor from each other.

One embodiment of the present invention can provide a novel separation method, a novel manufacturing method of a semiconductor device, or a novel manufacturing method of a display device. According to one embodiment of the present invention, a separation method, a manufacturing method of a semiconductor device, or a manufacturing method of a display device each having a low cost and a high productivity can be provided. According to one embodiment of the present invention, a manufacturing process of a semiconductor device or a display device can be simplified. According to one embodiment of the present invention, a semiconductor device or a display device can be manufactured using a large-sized substrate. According to one embodiment of the present invention, a highly reliable semiconductor device or display device can be provided. According to one embodiment of the present invention, a semiconductor device or a display device can be manufactured at low temperatures.

According to one embodiment of the present invention, a lightweight and highly reliable display device can be provided. According to one embodiment of the present invention, the display device can be thin or lightweight. According to one embodiment of the present invention, a flexible display device or a display device having a curved surface can be provided.

Note that the description of these effects does not preclude the existence of other effects. One embodiment of the present invention does not necessarily achieve all the effects listed above. Other effects can be derived from the description of the specification, the drawings, and the claims.

BRIEF DESCRIPTION OF THE DRAWINGS

In the accompanying drawings:

FIGS. 4A, 4B1, and 4B2 are cross-sectional views illustrating an example of a manufacturing method of a display device;

FIG. 6A illustrates a cross-sectional view of an example of a display device and FIGS. 6B1, 6B2, 6C1, and 6C2 are top views each illustrating positional relations of a conductive layer, a silicon layer, and a metal silicide layer;

DETAILED DESCRIPTION OF THE INVENTION

Figure 1A:
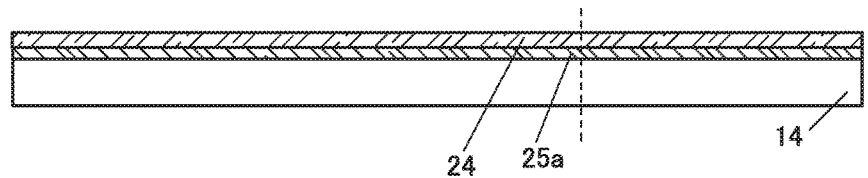
FIGS. 1A to 1E are cross-sectional views illustrating an example of a manufacturing method of a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following description of the embodiments.

Note that in structures of the present invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Embodiment 1

In this embodiment, a separation method, a flexible device, and a manufacturing method of the flexible device of one embodiment of the present invention will be described with reference to FIGS. 1A to 1E, FIGS. 2A to 2D, FIGS. 3A and 3B, FIGS. 4A, 4B1, and 4B2, FIGS. 5A to 5C, FIGS. 6A, 6B1, 6B2, 6C1, and 6C2, FIGS. 7A to 7E, FIGS. 8A to 8C, FIGS. 9A and 9B, FIGS. 10A and 10B, FIGS. 11A and 11B, FIGS. 12A and 12B, and FIGS. 13A and 13B.

The manufacturing method of the semiconductor device of one embodiment of the present invention includes the following steps: a step of forming a silicon layer over a formation substrate, a step of forming a resin layer over the silicon layer, a step of forming a transistor over the resin layer, a step of forming a conductive layer over the silicon layer and the resin layer, and a step of separating the formation substrate and the transistor from each other (also referred to as a separation step below). The resin layer is formed to have an opening over the silicon layer. The conductive layer is formed in contact with the silicon layer through the opening of the resin layer. In the separation step, the silicon layer is irradiated with light, so that silicon contained in the silicon layer reacts with a metal contained in the conductive layer to form a metal silicide layer.

In the separation step, separation occurs at the interface between the silicon layer and the resin layer, for example. Here, the opening is formed in the resin layer and the conductive layer is positioned so as to be in contact with the silicon layer through the opening, so that in the separation step, separation occurs at the interface between the silicon layer and the conductive layer in some cases. Accordingly, in the separation step, part of the conductive layer can be exposed, and the conductive layer can serve as a through electrode, a rear electrode, an external connection terminal, or the like. The conductive layer can be electrically connected to a circuit board such as a flexible printed circuit (FPC).

Here, it can be considered that the degree of adhesion between the silicon layer and the resin layer and the degree of adhesion between the silicon layer and the conductive layer are different from each other. Therefore, it can be considered that the separation interface in a region overlapping with the opening of the resin layer is formed between the silicon layer and the conductive layer, in the silicon layer, or between the silicon layer and the formation substrate. In the case where separation occurs in the silicon layer or between the silicon layer and the formation substrate, the silicon layer remains on the separation surface on the transistor side; thus, the conductive layer is not exposed or a smaller area of the conductive layer is exposed. When the conductive layer is not sufficiently exposed, it is difficult to reliably supply a signal or a potential to the conductive layer from the outside. Furthermore, when a step of removing the silicon layer is added so as to expose the conductive layer, the number of steps and manufacturing cost are increased.

Here, according to one embodiment of the present invention, metal that forms metal silicide (simply, silicide) by reacting with silicon is used as a material for the conductive layer. In the case where the conductive layer is formed of a plurality of layers, the metal is included in at least a layer that is in contact with the silicon layer. In the separation step, the silicon layer is irradiated with light, so that the silicon layer and the conductive layer react with each other and the metal silicide layer is formed in a region overlapping with the opening of the resin layer. Then, separation occurs at the interface between the metal silicide layer and the formation substrate, so that the metal silicide layer is exposed at the separation surface on the transistor side. The metal silicide has higher conductivity than that of silicon. Thus, even when the metal silicide layer remains on the separation surface on the transistor side, a signal or a potential can be supplied from the outside through the metal silicide layer. Furthermore, it is considered that the adhesion between the metal silicide layer and the conductive layer is higher than the adhesion between the metal silicide layer and the formation substrate. Hence, the separation interface in the region overlapping with the opening of the resin layer is likely to be formed between the metal silicide layer and the formation substrate. Thus, separation defects can be suppressed and the yield of the separation step can be improved.

The conductive layer contains the metal which can form a metal silicide by reacting with silicon. The conductive layer preferably contains one or more of nickel, cobalt, molybdenum, titanium, tungsten, vanadium, niobium, rhenium, palladium, platinum, erbium, and magnesium.

The conductive layer preferably contains a metal silicide which is easily formed and has low resistivity. Specifically, the conductive layer preferably contains nickel silicide or titanium silicide.

The conductive layer is preferably formed using the same material and the same manufacturing step as an electrode included in the transistor.

The silicon layer is preferably formed so as to contain hydrogen. As the silicon layer, a hydrogenated amorphous silicon layer is preferably formed.

In one embodiment of the present invention, the silicon layer is irradiated with light. The silicon layer preferably releases hydrogen by absorbing light and being heated upon the light irradiation. The release of hydrogen forms a brittle region or a region with a void in the silicon layer or on the surface of the silicon layer in some cases.

The silicon layer is irradiated with light to release hydrogen. This reduces the adhesion between the silicon layer and the layer in contact with the silicon layer and separation is performed at the interface between the two layers. Alternatively, by releasing hydrogen from the silicon layer, the silicon layer itself is damaged so that separation is performed in the silicon layer.

The light irradiation can be performed with a lamp, a laser apparatus, or the like. A laser apparatus is preferably used for the laser light irradiation.

The laser light irradiation is preferably performed with a laser apparatus, further preferably a linear laser apparatus. Laser apparatuses for the manufacturing lines for low temperature polysilicon (LTPS) and the like can be used, which enables effective use of the apparatuses. The linear laser condenses laser light in a long rectangular shape (the laser light is shaped into a linear laser beam) so that the inside of the silicon layer or the interface between the silicon layer and the resin layer is irradiated with light.

For the irradiation, light in a wavelength range of greater than or equal to 180 nm to less than or equal to 450 nm is preferably used.

In the case where the light irradiation is performed with a laser apparatus, the number of shots of laser light with which one portion is irradiated can be greater than or equal to 1 and less than or equal to 100, preferably greater than 1 and less than or equal to 50, further preferably greater than 1 and less than or equal to 10.

There are portions with low light intensity on both ends of the short axis of the laser beam. Accordingly, it is preferable that one shot and another shot overlap with each other by greater than or equal to the width of the portion with low light intensity. Therefore, the number of laser shots is preferably greater than or equal to 1.1, further preferably greater than or equal to 1.25.

In this specification, the number of laser shots refers to the number of times a point (region) is irradiated with laser light, and is determined by a beam width, scanning speed, a frequency, an overlap percentage, or the like. There is a portion between a pulse and another pulse when a linear beam is moved in a scanning direction, that is, a portion where one shot and another shot partly overlap with each other, and their overlapping ratio is referred to as an overlap percentage. Note that as the overlap percentage becomes closer to 100%, the number of shots is increased, and as the overlap percentage becomes further from 100%, the number of shots is decreased. The higher the scanning speed, the smaller the number of shots.

The expression "the number of shots of the laser light is 1.1" means that there is an overlap equivalent to approximately one-tenth of the beam width between two successive shots, and can mean that the overlap percentage is 10%. Similarly, the expression "the number of shots of the laser light is 1.25" means that there is an overlap equivalent to approximately one-fourth of the beam width between two successive shots, and can mean that the overlap percentage is 25%.

In one embodiment of the present invention, conditions of laser light irradiation are determined so that a condition where silicide reaction occurs between the silicon layer and the conductive layer and a condition of reducing adhesion between the silicon layer and the formation substrate are both satisfied.

It is preferred that the metal silicide be formed with the energy density and the number of shots of the laser light not exceeding those with which the adhesion between the silicon layer and the formation substrate is reduced. Thus, the metal material which can easily undergo silicide reaction is preferably used for the conductive layer. Accordingly, the number of substrates which can be processed by a laser apparatus can be increased. The running costs of a laser apparatus can be reduced by reducing the frequency of maintenance of the laser apparatus, for example. Consequently, the manufacturing costs of semiconductor devices, display devices, and the like can be reduced.

Furthermore, the adhesion between the silicon layer and the formation substrate is reduced by performing laser light irradiation under the condition where silicide reaction occurs between the silicon layer and the conductive layer.

In the case where LTPS is used for a channel formation region of a transistor, the resin layer is required to have heat resistance because heat at a temperature of approximately 500° C. to 550° C. needs to be applied. In some cases, the resin layer is required to have a larger thickness to relieve the damage in a laser crystallization step.

In contrast, a transistor including a metal oxide in a channel formation region can be formed at a temperature lower than or equal to 350° C., or even lower than or equal to 300° C. Therefore, the resin layer is not required to have high heat resistance. Accordingly, the upper temperature limit of the resin layer may be low, and the range of choices for the materials can be widened.

Furthermore, the transistor including a metal oxide in the channel formation region does not need a laser crystallization step. Furthermore, in this embodiment, the light irradiation can be performed at a lower energy density or with a smaller number of shots than that used in the laser crystallization step. The resin layer is irradiated with the laser light without through the substrate in the laser crystallization step, whereas the silicon layer or the resin layer is irradiated with the laser light through the formation substrate. Since damage to the resin layer is low as described above, the resin layer can be thin. Since the resin layer is not required to have high heat resistance and can be thinned, the manufacturing costs of a device can be significantly reduced. A metal oxide is preferably used, in which case the process can be simplified as compared with the case where LTPS is used.

Note that the display device of one embodiment of the present invention is not limited to the structure in which the transistor includes a metal oxide in the channel formation region. For example, in the display device of this embodiment, the transistor can include silicon in the channel formation region. As silicon, for example, amorphous silicon or crystalline silicon can be used. Examples of crystalline silicon include microcrystalline silicon, polycrystalline silicon, and single crystal silicon.

For the channel formation region, LTPS is preferably used. Polycrystalline silicon, e.g., LTPS, can be formed at a lower temperature than single crystal silicon and has higher field effect mobility and higher reliability than amorphous silicon.

In this embodiment, the transistor or the like is formed at a temperature lower than or equal to the upper temperature limit of the resin layer. The heat resistance of the resin layer can be measured by, for example, heat-induced weight loss percentage, specifically, 5% weight loss temperature. In the separation method of this embodiment and the manufacturing method of a display device of this embodiment, the maximum temperature in the process can be low. For example, in this embodiment, the 5% weight loss temperature of the resin layer can be higher than or equal to 200° C. and lower than or equal to 650° C., higher than or equal to 200° C. and lower than or equal to 500° C., higher than or equal to 200° C. and lower than or equal to 400° C., or higher than or equal to 200° C. and lower than or equal to 350° C. Thus, the range of choices for materials is widened. Note that the 5% weight loss temperature of the resin layer may be higher than 650° C.

In one embodiment of the present invention, the resin layer is formed using a photosensitive material. With the photosensitive material, a resin layer with a desired shape can be easily formed. For example, an opening can be easily formed in the resin layer.

The resin layer may have a thickness of greater than or equal to 0.1 µm and less than or equal to 5 µm. By forming the resin layer thin, the semiconductor device, the display device and the like can be fabricated at low cost. The semiconductor device, the display device and the like can be light-weight and thin. Moreover, the flexibility of the semiconductor device, the display device and the like can be increased.

A flexible device can be manufactured using the separation method of one embodiment of the present invention. A flexible device of one embodiment of the present invention and a manufacturing method thereof will be specifically described below with reference to FIGS. 1A to 1E, FIGS. 2A to 2D, FIGS. 3A and 3B, FIGS. 4A, 4B1, and 4B2, FIGS. 5A to 5C, FIGS. 6A, 6B1, 6B2, 6C1, and C2, FIGS. 7A to 7E, FIGS. 8A to 8C, FIGS. 9A and 9B, FIGS. 10A and 10B, FIGS. 11A and 11B, FIGS. 12A and 12B, and FIGS. 13A and 13B. Here, an example in which a display device including a transistor and an organic EL element (also referred to as an active matrix organic EL display device) is fabricated as the flexible device will be described. The display device can be bent by including a flexible material for its substrate.

Note that the thin films included in the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic chemical vapor deposition (MOCVD) method may be used.

The thin films constituting the display device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater.

When the thin films included in the display device are processed, a lithography method or the like can be used. Alternatively, island-shaped thin films may be formed by a film formation method using a blocking mask. Alternatively, the thin films may be processed by a nano-imprinting method, a sandblasting method, a lift-off method, or the like. Examples of the photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

As light for exposure in a photolithography method when using light, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

For etching of the thin film, dry etching, wet etching, a sandblast method, or the like can be used.

MANUFACTURING METHOD EXAMPLE 1

First, a silicon layer 25a is formed over a formation substrate 14 (FIG. 1A).

The formation substrate 14 has stiffness high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

The silicon layer 25a can release hydrogen by absorbing light and generating heat.

As the silicon layer 25a, for example, a silicon layer from which hydrogen is released by heating can be used. In particular, a hydrogenated amorphous silicon (a-Si:H) layer is preferably used. The hydrogenated amorphous silicon layer can be formed by, for example, a plasma CVD method using a deposition gas containing $SiH_4$. A silicon layer having crystallinity is preferably used as the silicon layer 25a. After the formation of the silicon layer 25a, heating can be performed under an atmosphere containing hydrogen so that the silicon layer 25a contains a large amount of hydrogen.

In this embodiment, the case where the hydrogenated amorphous silicon layer is formed as the silicon layer 25a is described.

The thickness of the silicon layer 25a is preferably greater than or equal to 5 nm and less than or equal to 300 nm, further preferably greater than or equal to 30 nm and less than or equal to 100 nm, for example.

Then, a first layer 24 is formed over the silicon layer 25a (see FIG. 1A).

The first layer 24 can be formed using any of a variety of resin materials (including resin precursors).

The first layer 24 is preferably formed using a thermosetting material.

The first layer 24 is preferably formed using a photosensitive material. When a photosensitive material is used, part of the first layer 24 is removed by a photolithography method, whereby a resin layer 23 having a desired shape can be formed.

Figure 1B:
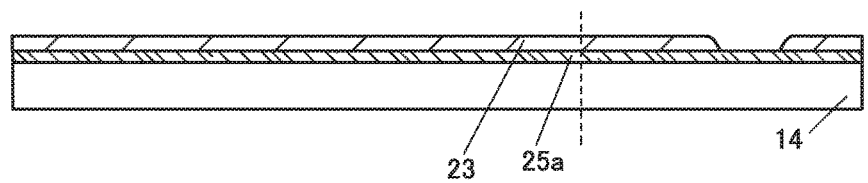

Specifically, heat treatment (also referred to as pre-baking treatment) for removing a solvent is performed after deposition of a material, and then light exposure is performed using a photomask. Next, development treatment is performed, whereby an unnecessary portion can be removed. Then, the film processed into a desired shape is heated (also referred to as post-baking) to form a resin layer 23 (FIG. 1B). In this embodiment, the resin layer 23 having an opening reaching the silicon layer 25a is formed.

The first layer 24 may be formed using a material without photosensitivity (also called a non-photosensitive material). A mask such as a resist mask or a hard mask is formed over the first layer 24 or the resin layer 23 and etching is performed, whereby the resin layer 23 with a desired shape can be formed. This method is particularly suitable for the case of using a non-photosensitive material.

For example, an inorganic film is formed over the resin layer 23, and a resist mask is formed over the inorganic film. After the inorganic film is etched with the use of the resist mask, the resin layer 23 can be etched using the inorganic film as a hard mask.

As examples of an inorganic film that can be used as the hard mask, a variety of inorganic insulating films, metal films and alloy films that can be used for a conductive layer, and the like can be given.

It is preferable to form the mask with an extremely small thickness and remove the mask concurrently with the etching, in which case a step of removing the mask can be eliminated.

The first layer 24 is preferably formed using a material containing a polyimide resin, a polyimide resin precursor, or an acrylic resin. The first layer 24 can be formed using, for example, a material containing a polyimide resin and a solvent, a material containing polyamic acid and a solvent, or a material containing an acrylic resin and a solvent. Note that the first layer 24 is preferably formed using a material containing a polyimide resin or a polyimide resin precursor to have relatively high heat resistance. Meanwhile, the first layer 24 is preferably formed using a material containing an acrylic resin to have higher visible-light transmitting property. The polyimide resin and the acrylic resin are a material suitable for a planarization film or the like of the display device; hence, a common deposition apparatus and a common material can be shared. Thus, there is no need to prepare another apparatus and another material to obtain the structure of one embodiment of the present invention. Since the first layer 24 does not need a special material and can be formed using a resin material used for the display device as described above, cost reduction can be achieved.

Examples of resin materials which can be used to form the first layer 24 include an epoxy resin, a polyamide resin, a polyimide-amide resin, a siloxane resin, a benzocyclobutene-based resin, a phenol resin, and precursors of these resins.

The first layer 24 can be formed by spin coating, dipping, spray coating, ink-jetting, dispensing, screen printing, or offset printing, or with a doctor knife, a slit coater, a roll coater, a curtain coater, or a knife coater, for example.

The post-baking treatment can be performed while a gas containing one or more of oxygen, nitrogen, and a rare gas (e.g., argon) is supplied into a chamber of a heating apparatus, for example. Alternatively, the post-baking treatment can be performed in an air atmosphere with the use of a chamber of a heating apparatus, a hot plate, or the like.

By the heat treatment, released gas components (e.g., hydrogen or water) in the resin layer 23 can be reduced. In particular, the heat treatment is preferably performed at a temperature higher than or equal to the fabricating temperature of each layer formed over the resin layer 23. Thus, a gas released from the resin layer 23 in the manufacturing process of the transistor can be significantly reduced.

For example, in the case where the manufacturing temperature of the transistor is lower than or equal to 350° C., a film to be the resin layer 23 is preferably heated at a temperature higher than or equal to 350° C. and lower than or equal to 450° C., further preferably lower than or equal to 400° C., still further preferably lower than or equal to 375° C. Thus, a gas released from the resin layer 23 in the manufacturing process of the transistor can be significantly reduced.

In the post-baking treatment, heating is preferably performed at a temperature at which hydrogen is less likely to be released from the silicon layer 25a. Accordingly, a defect such as separation of the silicon layer 25a before irradiation with laser light can be prevented and thus a decrease in yield can be suppressed. Note that the steps performed before the silicon layer 25a is irradiated with laser light, which will be described later, are preferably performed at a temperature at which hydrogen is less likely to be released from the silicon layer 25a.

The temperature of the post-bake treatment is preferably set to lower than or equal to the maximum temperature in manufacturing the transistor. When the temperature of the heat treatment is set to lower than or equal to the maximum temperature in manufacturing the transistor, a manufacturing apparatus for the manufacturing process of the transistor, for example, can also be utilized for the manufacturing method of the display device of this embodiment, which reduces additional capital investment and the like. As a result, the display device can be manufactured at reduced costs. When the manufacturing temperature of the transistor is lower than or equal to 350° C., for example, the temperature of the post-bake treatment is preferably lower than or equal to 350° C.

The maximum temperature in manufacturing the transistor is preferably equal to the temperature of the post-bake treatment, in which case it is possible to prevent the post-bake treatment from increasing the maximum temperature in manufacturing the display device and it is also possible to reduce the released gas components in the resin layer 23.

Even when the heating temperature is relatively low, increasing treatment time enables separability as high as the separability that is obtained at higher heating temperatures in some cases. It is thus preferable that the treatment time be set long when the heating temperature cannot be set high owing to the structure of the heating apparatus.

The duration of the post-bake treatment is preferably longer than or equal to five minutes and shorter than or equal to 24 hours, further preferably longer than or equal to 30 minutes and shorter than or equal to 12 hours, still further preferably longer than or equal to one hour and shorter than or equal to six hours, for example. Note that the duration of the post-bake treatment is not particularly limited to these examples. For example, the duration of the post-bake treatment that is performed by a rapid thermal annealing (RTA) method may be shorter than five minutes.

As the heating apparatus, it is possible to use, for example, an electric furnace or any apparatus for heating an object by heat conduction or heat radiation from a heating element such as a resistance heating element. For example, an RTA apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. With such an RTA apparatus, the treatment time can be shortened and thus the RTA apparatus is preferred for mass production. Alternatively, an in-line heating apparatus may be used in the post-bake treatment.

Note that the post-bake treatment sometimes makes the resin layer 23 thinner or thicker than the first layer 24. For example, in some cases, the volume decreases when the solvent contained in the first layer 24 is removed or when the density increases with proceeding curing, which makes the thickness of the resin layer 23 smaller than that of the first layer 24.

Before the post-bake treatment, pre-baking treatment for removing the solvent contained in the first layer 24 may be performed. The temperature of the prebaking treatment can be set as appropriate according to the material that is used. For example, the temperature of the pre-baking treatment can be higher than or equal to 50° C. and lower than or equal to 180° C., higher than or equal to 80° C. and lower than or equal to 150° C., or higher than or equal to 90° C. and lower than or equal to 120° C. The post-baking treatment may double as the pre-baking treatment, in which case the solvent contained in the first layer 24 can be removed by the post-baking treatment.

The resin layer 23 has flexibility. The formation substrate 14 has lower flexibility than the resin layer 23.

The resin layer 23 preferably has a thickness of greater than or equal to 0.01 μm and less than 10 μm, further preferably greater than or equal to 0.1 μm and less than or equal to 5 μm, still further preferably greater than or equal to 0.5 μm and less than or equal to 3 μm. By forming the resin layer thin, the display device can be manufactured at low costs. The display device can be lightweight and thin. The display device can have higher flexibility. The use of a solution having low viscosity facilitates the formation of the resin layer 23 having a small thickness. One embodiment of the present invention is not limited to the above examples, and the thickness of the resin layer 23 may be greater than or equal to 10 μm. For example, the resin layer 23 may have a thickness of greater than or equal to 10 μm and less than or equal to 200 μm. The resin layer 23 preferably has a thickness of greater than or equal to 10 μm because the rigidity of the display device can be increased.

The resin layer 23 preferably has a thermal expansion coefficient of greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. The lower the thermal expansion coefficient of the resin layer 23 is, the more the warpage of the formation substrate 14, the more the generation of a crack in a layer included in a transistor or the like, and breakage of a transistor or the like which are caused owing to the heating can be prevented.

Figure 1C:
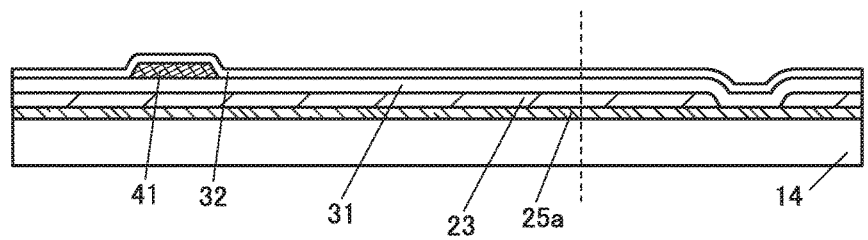

Next, an insulating layer 31 is formed over the resin layer 23 (FIG. 1C).

The insulating layer 31 is formed at a temperature lower than or equal to the upper temperature limit of the resin layer 23. The insulating layer 31 is preferably formed at a temperature lower than or equal to the heating temperature in the above-described post-baking treatment.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 23 and a silicon oxide film be formed over the silicon nitride film. An inorganic insulating film is preferably formed at high temperatures because the film can have higher density and a higher barrier property as the deposition temperature becomes higher.

In the case of using an inorganic insulating film for the insulating layer 31, substrate temperature during the formation is preferably higher than or equal to room temperature (25° C.) and lower than or equal to 350° C., and further preferably higher than or equal to 100° C. and lower than or equal to 300° C.

In the case where the resin layer 23 has an uneven surface, the insulating layer 31 preferably covers the unevenness. The insulating layer 31 may function as a planarization layer that fills the unevenness. It is preferable to use a stack including an organic insulating material and an inorganic insulating material for the insulating layer 31, for example. As the organic insulating material, for example, a resin that can be used for the resin layer 23 can be used.

In the case of using an organic insulating film for the insulating layer 31, the temperature of heat applied to the resin layer 23 at the time of formation of the insulating layer 31 is preferably higher than or equal to room temperature and lower than or equal to 350° C., further preferably higher than or equal to room temperature and lower than or equal to 300° C.

Figure 1D:
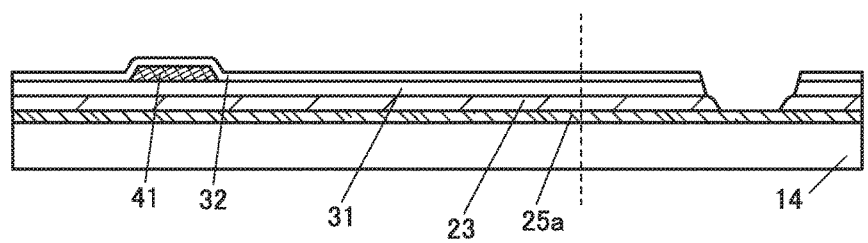
Figure 1E:
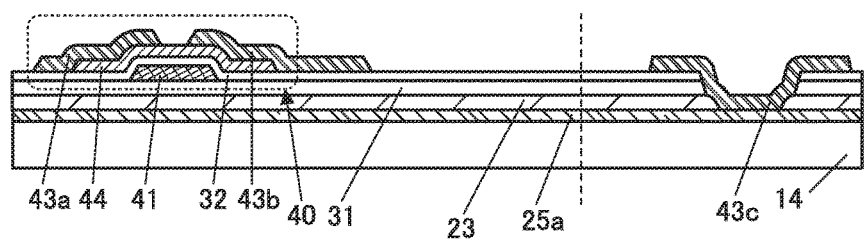

Next, a transistor 40 is formed over the insulating layer 31 (FIGS. 1C to 1E).

There is no particular limitation on the structure of the transistor in the display device. For example, a planar transistor, a staggered transistor, or an inverted staggered transistor may be used. Furthermore, a top-gate transistor or a bottom-gate transistor may be used. Gate electrodes may be provided above and below a channel.

Here, the case where a bottom-gate transistor including a metal oxide layer 44 is formed as the transistor 40 is described. The metal oxide layer 44 can serve as a semiconductor layer of the transistor 40. The metal oxide can serve as an oxide semiconductor.

According to one embodiment of the present invention, an oxide semiconductor is used as a semiconductor of the transistor. A semiconductor material having a wider band gap and a lower carrier density than silicon is preferably used because off-state current of the transistor can be reduced.

Furthermore, the transistor 40 is formed at a temperature lower than or equal to the upper temperature limit of the resin layer 23. The transistor 40 is preferably formed at a temperature lower than or equal to the heating temperature in the above-described post-baking treatment.

Specifically, first, a conductive layer 41 is formed over the insulating layer 31 (FIG. 1C). The conductive layer 41 can be formed in the following manner: a conductive film is formed, a resist mask is formed, the conductive film is etched, and the resist mask is removed.

The substrate temperature in a step of forming the conductive film is preferably higher than or equal to room temperature and lower than or equal to 350° C., further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO to which gallium is added, or indium tin oxide containing silicon may be used. Alternatively, a semiconductor such as an oxide semiconductor or polycrystalline silicon whose resistance is lowered by containing an impurity element or the like, or silicide such as nickel silicide may be used. A film including graphene may be used as well. The film including graphene can be formed, for example, by reducing a film including graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed (FIG. 1C). For the insulating layer 32, the inorganic insulating film that can be used for the insulating layer 31 can be used.

Next, an opening of the insulating layer 31 and an opening of the insulating layer 32 are provided in a region overlapping with the opening of the resin layer 23 (FIG. 1D). Here, an example in which the openings of the insulating layer 31 and the insulating layer 32 are formed at a time is shown. The opening of the insulating layer 31 and the opening of the insulating layer 32 may be formed in different steps. For example, the opening may be formed in the insulating layer 31 before the conductive layer 41 is formed. By providing the openings, the silicon layer 25a is exposed.

Then, the metal oxide layer 44 is formed (FIG. 1E). The metal oxide layer 44 can be formed in the following manner: a metal oxide film is formed, a resist mask is formed, the metal oxide film is etched, and the resist mask is removed.

The substrate temperature during the deposition of the metal oxide film is preferably lower than or equal to 350° C., further preferably higher than or equal to room temperature and lower than or equal to 200° C., and still further preferably higher than or equal to room temperature and lower than or equal to 130° C.

The metal oxide film can be formed using one of or both an inert gas and an oxygen gas. Note that there is no particular limitation on the flow rate ratio of oxygen (the partial pressure of oxygen) in the step of forming the metal oxide film. In the case where a transistor having high field-effect mobility is obtained, the flow rate ratio of oxygen (the partial pressure of oxygen) in the step of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, indium and zinc are preferably contained.

The energy gap of the metal oxide is preferably 2 eV or more, further preferably 2.5 eV or more, and still further preferably 3 eV or more. The use of such a metal oxide having a wide energy gap leads to a reduction in off-state current of a transistor.

The metal oxide film can be formed by a sputtering method. Alternatively, a PLD method, a PECVD method, a thermal CVD method, an ALD method, a vacuum evaporation method, or the like may be used.

Next, a conductive layer 43a, a conductive layer 43b, and a conductive layer 43c are formed (FIG. 1E). The conductive layer 43a, the conductive layer 43b, and the conductive layer 43c can be formed in the following manner: a conductive film is formed, a resist mask is formed, the conductive film is etched, and the resist mask is removed. Each of the conductive layers 43a and 43b is connected to the metal oxide layer 44. The conductive layer 43c is connected to the silicon layer 25a through the openings provided in the resin layer 23, the insulating layer 31, and the insulating layer 32.

The metal material which can form a metal silicide by reacting with silicon is preferably used as the material for the conductive film to be the conductive layer 43c. The conductive film preferably contains one or more of nickel, cobalt, molybdenum, titanium, tungsten, vanadium, niobium, rhenium, palladium, platinum, erbium, and magnesium, for example.

Note that during the processing for forming the conductive layer 43a and the conductive layer 43b, the metal oxide layer 44 might be partly etched to be thin in a region not covered by the resist mask.

The substrate temperature during the formation of the conductive film is preferably higher than or equal to room temperature and lower than or equal to 350° C., further preferably higher than or equal to room temperature and lower than or equal to 300° C.

In the above manner, the transistor 40 can be fabricated (FIG. 1E). In the transistor 40, part of the conductive layer 41 functions as a gate, part of the insulating layer 32 functions as a gate insulating layer, and the conductive layer 43a and the conductive layer 43b function as a source and a drain.

Figure 2A:
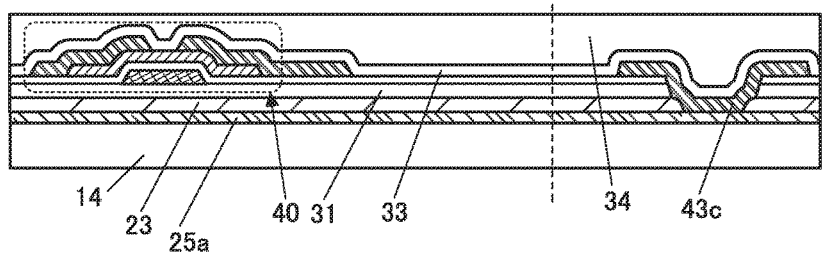
FIGS. 2A to 2D are cross-sectional views illustrating an example of a manufacturing method of a display device.

Next, an insulating layer 33 covering the transistor 40 is formed (FIG. 2A). The insulating layer 33 can be formed using a method similar to that of the insulating layer 31.

It is preferable to use an oxide insulating film, such as a silicon oxide film or a silicon oxynitride film, formed in an oxygen-containing atmosphere for the insulating layer 33. An insulating film with low oxygen diffusibility and oxygen permeability, such as a silicon nitride film, is preferably stacked over the silicon oxide film or the silicon oxynitride film. The oxide insulating film formed at low temperature in an oxygen-containing atmosphere can easily release a large amount of oxygen by heating. When a stack including such an oxide insulating film that releases oxygen and such an insulating film with low oxygen diffusibility and oxygen permeability is heated, oxygen can be supplied to the metal oxide layer 44. As a result, oxygen vacancies in the metal oxide layer 44 can be filled and defects at the interface between the metal oxide layer 44 and the insulating layer 33 can be repaired, leading to a reduction in defect levels. Accordingly, a flexible device with extremely high reliability can be manufactured.

Through the above steps, the insulating layer 31, the transistor 40, and the insulating layer 33 can be formed over the resin layer 23 (FIG. 2A).

If the formation substrate 14 and the transistor 40 are separated from each other at this stage by a method described later, a flexible device including no display element can be fabricated. Forming the transistor 40 or forming a capacitor, a resistor, a wiring, and the like in addition to the transistor 40, and separating the formation substrate 14 and the transistor 40 from each other by the method described later can provide a flexible device including a semiconductor circuit, for example.

Then, an insulating layer 34 is formed over the insulating layer 33 (FIG. 2A). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the upper temperature limit of the resin layer 23. The insulating layer 34 is preferably formed at a temperature lower than or equal to the heating temperature in the above-described post-baking treatment.

In the case of using an organic insulating film for the insulating layer 34, it is preferable that the temperature applied to the resin layer 23 in forming the insulating layer 34 be higher than or equal to room temperature and lower than or equal to 350° C., further preferably higher than or equal to room temperature and lower than or equal to 300° C.

In the case of using an inorganic insulating film as the insulating layer 34, the substrate temperature during the film formation is preferably higher than or equal to room temperature and lower than or equal to 350° C., further preferably higher than or equal to 100° C. and lower than or equal to 300° C.

Next, an opening reaching the conductive layer 43b is formed in the insulating layer 34 and the insulating layer 33.

Figure 2B:
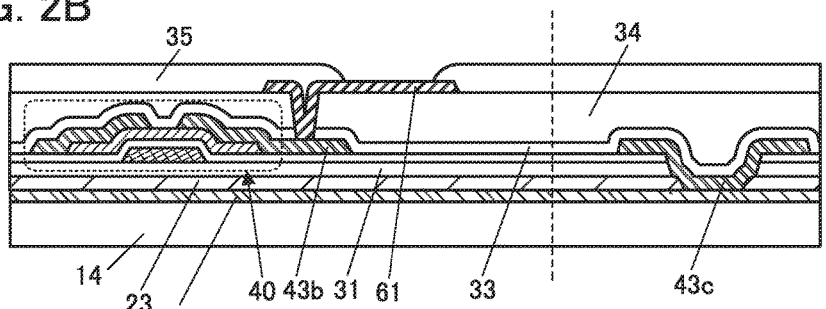

After that, a conductive layer 61 is formed (FIG. 2B). Part of the conductive layer 61 functions as a pixel electrode of a display element 60. The conductive layer 61 is connected to the conductive layer 43b through the opening provided in the insulating layer 33 and the insulating layer 34. The conductive layer 61 can be formed in the following manner: a conductive film is formed, a resist mask is formed, the conductive film is etched, and the resist mask is removed.

Furthermore, the conductive layer 61 is formed at a temperature lower than or equal to the upper temperature limit of the resin layer 23. The conductive layer 61 is preferably formed at a temperature lower than or equal to the heating temperature in the above-described post-baking treatment.

The substrate temperature in a step of forming the conductive film is preferably higher than or equal to room temperature and lower than or equal to 350° C., further preferably higher than or equal to room temperature and lower than or equal to 300° C.

Next, an insulating layer 35 is formed to cover an end portion of the conductive layer 61 (FIG. 2B). For the insulating layer 35, the description of the organic insulating film or the inorganic insulating film that can be used for the insulating layer 31 can be referred to.

The insulating layer 35 is formed at a temperature lower than or equal to the upper temperature limit of the resin layer 23. The insulating layer 35 is preferably formed at a temperature lower than or equal to the heating temperature in the above-described post-baking.

In the case of using an organic insulating film for the insulating layer 35, it is preferable that the temperature applied to the resin layer 23 in forming the insulating layer 35 be higher than or equal to room temperature and lower than or equal to 350° C., further preferably higher than or equal to room temperature and lower than or equal to 300° C.

In the case of using an inorganic insulating film as the insulating layer 35, the substrate temperature during the film formation is preferably higher than or equal to room temperature and lower than or equal to 350° C., further preferably higher than or equal to 100° C. and lower than or equal to 300° C.

Figure 2C:
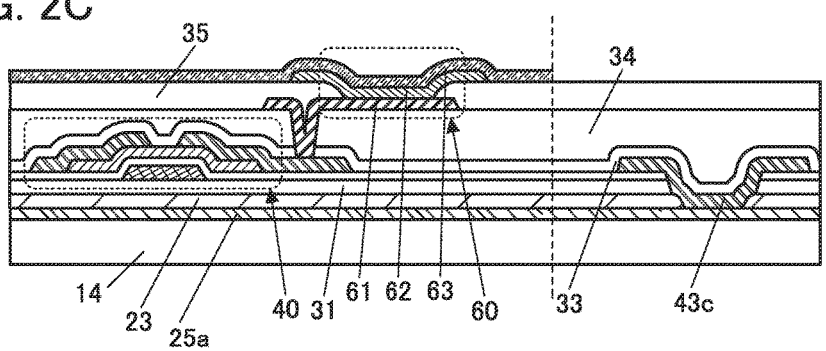

Then, an EL layer 62 and a conductive layer 63 are formed (FIG. 2C). Part of the conductive layer 63 functions as a common electrode of the display element 60.

The EL layer 62 can be formed by an evaporation method, a coating method, a printing method, a discharge method, or the like. In the case where the EL layer 62 is formed for each individual pixel, an evaporation method using a blocking mask such as a metal mask, an ink-jet method, or the like can be used. In the case of sharing the EL layer 62 by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The EL layer 62 and the conductive layer 63 are each formed at a temperature lower than or equal to the upper temperature limit of the resin layer 23. The EL layer 62 and the conductive layer 63 are preferably formed at a temperature lower than or equal to the heating temperature in the above-described post-baking treatment. The conductive layer 63 is formed at a temperature lower than or equal to the upper temperature limit of the EL layer 62.

Specifically, the EL layer 62 and the conductive layer 63 are each preferably formed at a temperature higher than or equal to room temperature and lower than or equal to 350° C. and further preferably higher than or equal to room temperature and lower than or equal to 300° C.

In the above manner, the display element 60 can be formed (FIG. 2C). In the display element 60, the conductive layer 61 part of which functions as a pixel electrode, the EL layer 62, and the conductive layer 63 part of which functions as a common electrode are stacked.

Although an example of manufacturing a top-emission light-emitting element as the display element 60 is shown here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Figure 2D:
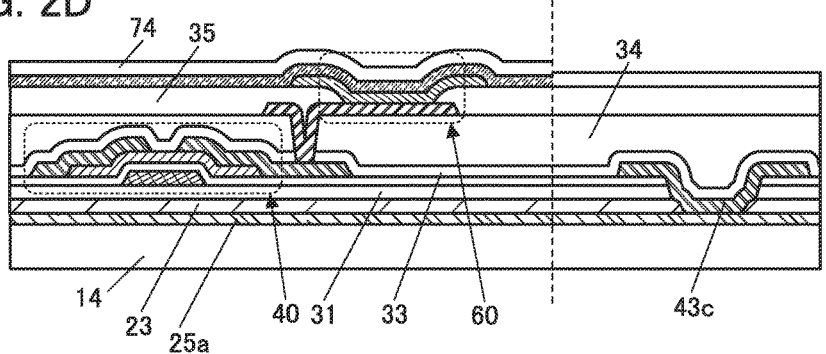

Next, the insulating layer 74 is preferably formed so as to cover the conductive layer 63 (FIG. 2D). The insulating layer 74 functions as a protective layer that prevents diffusion of impurities such as water into the display element 60. The display element 60 is sealed with the insulating layer 74. After the conductive layer 63 is formed, the insulating layer 74 is preferably formed without exposure to the air.

The insulating layer 74 is formed at a temperature lower than or equal to the upper temperature limit of the resin layer 23 and lower than or equal to the upper temperature limit of the display element 60. The insulating layer 74 is preferably formed at a temperature lower than or equal to the heating temperature in the above-described post-baking treatment.

The insulating layer 74, for example, preferably contains an inorganic insulating film with a high barrier property that can be used for the above-described insulating layer 31. A stack including an inorganic insulating film and an organic insulating film can also be used.

The insulating layer 74 can be formed by an ALD method, a sputtering method, or the like. An ALD method and a sputtering method are preferable because a film can be formed at low temperatures. An ALD method is preferable because the coverage of the insulating layer 74 is improved.

Figure 3A:
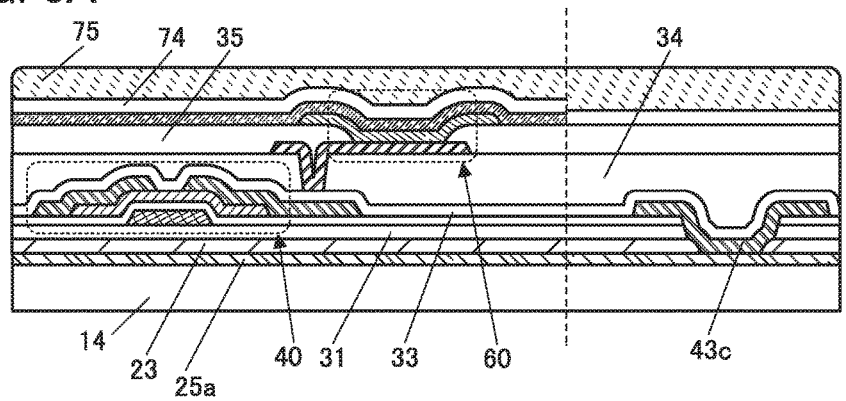
FIGS. 3A and 3B are cross-sectional views illustrating an example of a manufacturing method of a display device.

Then, the protective layer 75 is formed over the insulating layer 74 (FIG. 3A). The protective layer 75 can be used as a layer positioned on the outermost surface of the display device 10. The protective layer 75 preferably has a high visible-light transmitting property.

The above-described organic insulating film that can be used for the insulating layer 31 is preferably used for the protective layer 75 because the surface of the display device can be prevented from being damaged or cracked. Furthermore, in the protective layer 75, a hard coat layer (e.g., a silicon nitride layer) by which a surface is protected from damage, a layer (e.g., an aramid resin layer) that can disperse pressure, or the like may be stacked.

Figure 3B:
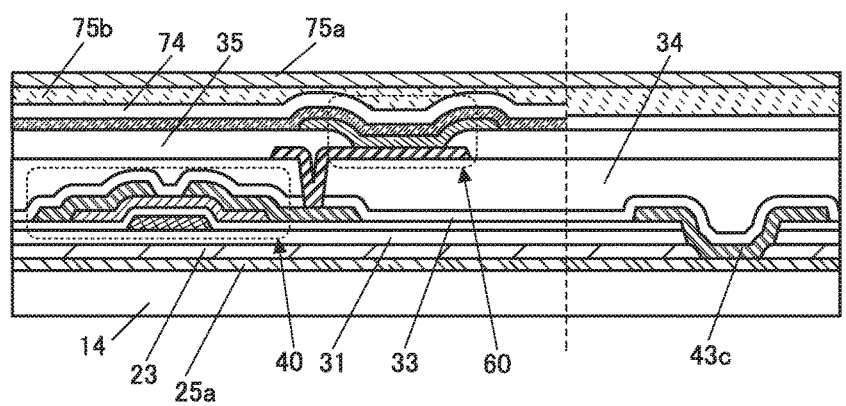

FIG. 3B illustrates an example in which a substrate 75a is attached to the insulating layer 74 with a bonding layer 75b. Examples of the substrate 75a include a resin and the like. The substrate 75a preferably has flexibility.

Any of a variety of curable adhesives, e.g., light curable adhesives such as a UV curable adhesive, a reactive curable adhesive, a thermal curable adhesive, and an anaerobic adhesive can be used for the bonding layer 75b. Still alternatively, an adhesive sheet or the like may be used.

Examples of materials that can be used for the substrate 75a include polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber.

Next, the silicon layer 25a is irradiated with laser light 65 through the formation substrate 14 (FIGS. 4A and 4B1). The laser light 65 is a linear laser beam with which scanning is performed from the left to the right in FIGS. 4A and 4B1, for example, and the major axis is perpendicular to the scanning direction and the incident direction (from the bottom to the top).

As shown in FIGS. 4A and 4B1, by the irradiation with the laser light 65, the amorphous silicon included in the silicon layer 25a is crystallized and the silicon layer 25b is formed. The silicon layer 25b contains polysilicon, for example.

Then, as shown in FIG. 4B1, by the irradiation with the laser light 65, the metal contained in the conductive layer 43c reacts with silicon contained in the silicon layer 25a and a metal silicide layer 25c is formed. In FIG. 4B1, an example in which part of the silicon layer 25a becomes the metal silicide layer 25c is shown; however, one embodiment of the present invention is not limited to this example. As shown in FIG. 4B2, part of the conductive layer 43c also becomes the metal silicide layer 25c in some cases.

By the irradiation with the laser light 65, the silicon layer 25a is heated and hydrogen is released from the silicon layer 25a. At this time, hydrogen is released in a gaseous state, for example. The released gas remains near the interface between the silicon layer 25b and the resin layer 23 or near the interface between the silicon layer 25b and the formation substrate 14; thus, the force for separating these layers. Consequently, the adhesion between the silicon layer 25b and the resin layer 23 or the adhesion between the silicon layer 25b and the formation substrate 14 is reduced to make a state where separation can be easily achieved.

Furthermore, part of hydrogen in the silicon layer 25a remains in the silicon layer 25a in some cases. Therefore, the silicon layer 25a (25b) is embrittled and separation is likely to occur inside the silicon layer 25b in some cases.

As the laser light 65, light having a wavelength by which at least part of the laser light 65 is transmitted through the formation substrate 14 and absorbed by the silicon layer 25a is selected. The laser light 65 is preferably light having a wavelength which is absorbed by the resin layer 23. The laser light 65 is preferably light having a wavelength range from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. The excimer laser is preferable because the excimer laser can be used also for laser crystallization of LTPS, so that the existing LTPS production line device can be used and new capital investment is not necessary. Alternatively, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running costs can be reduced compared with that of an excimer laser. Further alternatively, a pulsed laser such as a picosecond laser may be used.

In the case where linear laser light is used as the laser light 65, the formation substrate 14 and a light source are relatively moved to perform scanning with the laser light 65; in this way, a region that is desirably separated is irradiated with the laser light 65.

The resin layer 23 might absorb part of the laser light 65. Thus, an element such as a transistor is irradiated with the laser light 65 which is transmitted through the silicon layer 25a and an adverse effect on the characteristics of the element can be suppressed.

Figure 5A:
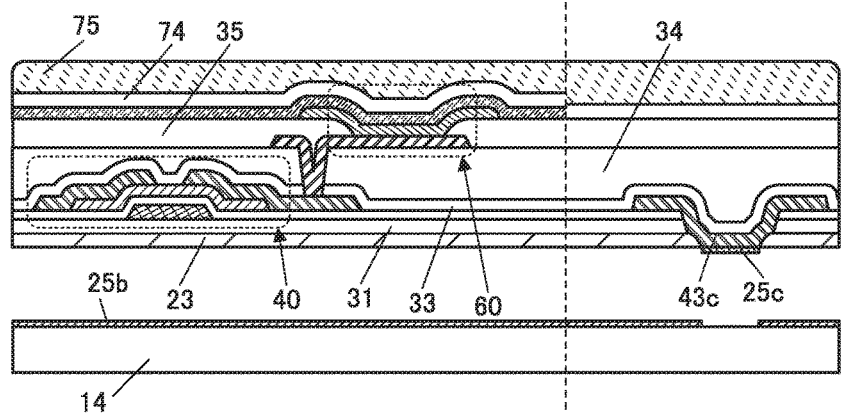
FIGS. 5A to 5C are cross-sectional views illustrating an example of a manufacturing method of a display device.
Figure 5B:
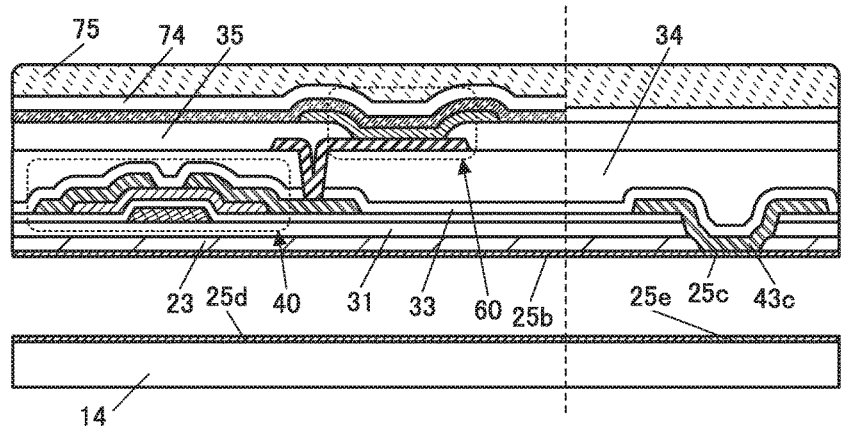
Figure 5C:
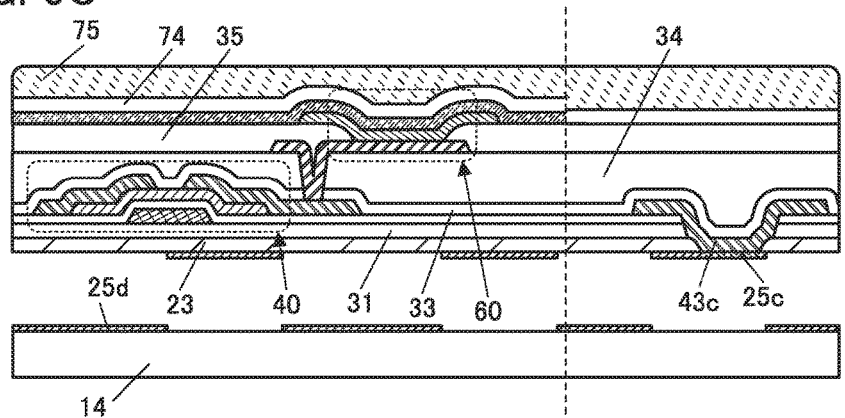

Next, the formation substrate 14 and the transistor 40 are separated from each other (FIG. 5A, 5B, or 5C).

The formation substrate 14 can be separated by applying a perpendicular tensile force to the silicon layer 25b, for example. Specifically, the formation substrate 14 can be separated by attaching a mechanism to part of the top surface of the protective layer 75 and pulling up the protective layer 75.

By inserting a sharp instrument such as a knife between the formation substrate 14 and the insulating layer 31, the separation starting point is preferably formed.

FIG. 5A shows an example where separation occurs at the interface between the silicon layer 25b and the resin layer 23 and the interface between the formation substrate 14 and the metal silicide layer 25c.

The metal silicide layer 25c is a layer formed by the reaction between the silicon layer 25a and the conductive layer 43c; thus, it is considered that the adhesion between the metal silicide layer 25c and the conductive layer 43c is high. Thus, it is considered that in the stacked-layer structure of the formation substrate 14, the metal silicide layer 25c, and the conductive layer 43c, the separation surface is at the interface between the formation substrate 14 and the metal silicide layer 25c.

The resin layer 23 and the metal silicide layer 25c are exposed at the separation surface on the transistor 40 side.

FIG. 5B illustrates an example in which separation occurs in the silicon layer 25b and the metal silicide layer 25c. Part of the silicon layer (a silicon layer 25d) and part of the metal silicide layer (a metal silicide layer 25e) remain over the formation substrate 14. The silicon layer 25b and the metal silicide layer 25c that remain on the resin layer 23 and the conductive layer 43c side are thinner than the silicon layer 25b and the metal silicide layer 25c in FIG. 4B1.

FIG. 5C shows an example where separation occurs at both the interface between the silicon layer 25b and the resin layer 23 and the interface between the formation substrate 14 and the silicon layer 25b. Furthermore, in the examples shown in FIG. 5C, separation occurs at the interface between the formation substrate 14 and the metal silicide layer 25c. The resin layer 23, the silicon layer 25b, and the metal silicide layer 25c are exposed at the separation surface on the transistor 40 side.

As shown in FIG. 5A to 5C, the metal silicide layer 25c which is connected to the conductive layer 43c is exposed at the separation surface on the transistor 40 side. Therefore, the signal or the potential can be supplied from the outside to the conductive layer 43c through the metal silicide layer 25c.

The silicon layer 25b remains on the separation surface on the transistor 40 side in some cases. However, since the silicon layer 25b has lower conductivity than the metal silicide layer 25c, a short circuit is hardly caused between the plurality of conductive layers 43c through the silicon layer 25b. Thus, even when the silicon layer 25b remains on the separation surface on the transistor 40 side, the silicon layer 25b does not need to be removed and an increase in the number of manufacturing steps can be prevented.

The silicon layer 25d and the metal silicide layer 25e remaining on the formation substrate 14 side are preferably removed and the formation substrate 14 is preferably reused.

The silicon layer 25d and the metal silicide layer 25e can be removed by etching such as plasma etching or wet etching. Note that the above etching can be effectively employed also in the case where the silicon layer 25b and the metal silicide layer 25c which remain on the transistor 40 side are removed. Furthermore, the resin layer 23 can be removed by ashing, for example.

Figure 6A:
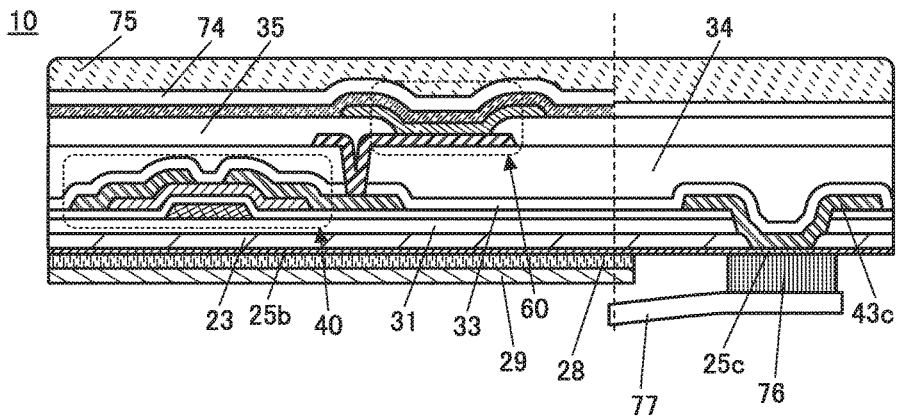
Figure 6A:
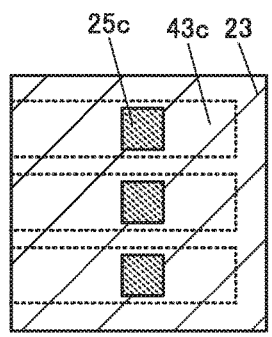
Figure 6A:
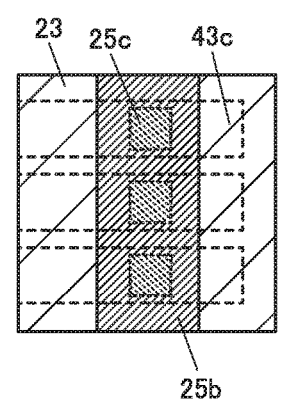
Figure 6A:
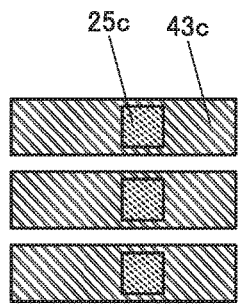
Figure 6A:
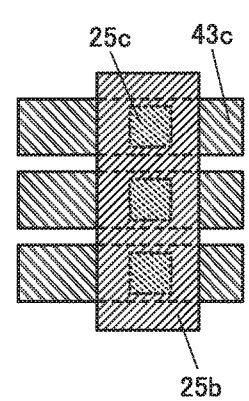

The separation of the formation substrate 14 and the transistor 40 can complete the display device 10 (FIG. 6A). The display device 10 can remain bent or can be bent repeatedly, for example.

As illustrated in FIG. 6A, a substrate 29 may be bonded to the surface of the resin layer 23 exposed by separation, by a bonding layer 28. Note that the substrate 29 and the bonding layer 28 are provided in a position that does not overlap with the metal silicide layer 25c. The substrate 29 can function as a supporting substrate of the flexible device. FIG. 6A illustrates an example where the substrate 29 is bonded to the resin layer 23 with the bonding layer 28.

The substrate 29 can be formed using the material that can be used for the substrate 75a.

Then, the conductive layer 43c and an FPC 77 are electrically connected to each other through a connector 76 and the metal silicide layer 25c (FIG. 6A).

As the connector 76, any of various anisotropic conductive films (ACF), anisotropic conductive pastes (ACP), and the like can be used.

In this embodiment, an example using a top-emission light-emitting element is shown. Since the protective layer 75 side is the display surface side in the case where the conductive layer 43c is exposed from the protective layer 75 side and electrically connected to the FPC 77, the display region and the FPC 77 cannot overlap with each other and thus, there is a limit in the region where the FPC 77 overlaps with the display device. According to one embodiment of the present invention, a photosensitive material is used for the resin layer 23 and the metal which forms metal silicide by reacting with silicon is used for the conductive layer 43c, so that the metal silicide layer 25c is exposed from the surface on the opposite side of the display surface. Therefore, the conductive layer 43c and the FPC 77 can be electrically connected to each other through the metal silicide layer 25c. Such a structure allows the FPC 77 to be positioned on the side opposite to the display surface. Thus, a space for bending the FPC 77 in incorporating the display device in an electronic device can be saved, which enables the electronic device to be smaller.

Through the above steps, the display device using a metal oxide for the transistor and a separate coloring method for an EL element can be fabricated (FIG. 6A).

Positional relations of the conductive layer 43c, the silicon layer 25b, and the metal silicide layer 25c are described with reference to FIGS. 6B1, 6B2, 6C1, and 6C2.

FIGS. 6B1 and 6C1 are top views of the separation surface on the transistor 40 side in FIG. 5A. In FIG. 6B1, the resin layer 23, the conductive layer 43c, and the metal silicide layer 25c are illustrated. FIG. 6C1 is the same as FIG. 6B1 except that the resin layer 23 is not illustrated.

As shown in FIGS. 6B1 and 6C1, the plurality of metal silicide layers 25c is exposed on the separation surface. These metal silicide layers 25c are electrically insulated from each other by the resin layer 23. One metal silicide layer 25c is electrically connected to one conductive layer 43c. With such a structure, the plurality of conductive layers 43c is not short-circuited and the signal or the potential is supplied from the outside to the plurality of conductive layers 43c through the metal silicide layers 25c.

FIGS. 6B2 and 6C2 are top views of the separation surface on the transistor 40 side in FIG. 5C. In FIG. 6B2, the resin layer 23, the conductive layer 43c, the silicon layer 25b, and the metal silicide layer 25c are illustrated. FIG. 6C2 is the same as FIG. 6B2 except that the resin layer 23 is not illustrated.

As shown in FIGS. 6B2 and 6C2, the silicon layer 25b and the plurality of metal silicide layers 25c are exposed at the separation surface. The plurality of metal silicide layers 25c is a region having high conductivity and the silicon layer 25b is a region having a resistivity that is higher than that of the metal silicide layer 25c. Thus, the plurality of metal silicide layers 25c is electrically insulated from each other by the silicon layer 25b. One metal silicide layer 25c is electrically connected to one conductive layer 43c. With such a structure, the plurality of conductive layers 43c is not short-circuited and the signal or the potential is supplied from the outside to the plurality of conductive layers 43c through the metal silicide layer 25c.

MANUFACTURING METHOD EXAMPLE 2

Figure 7A:
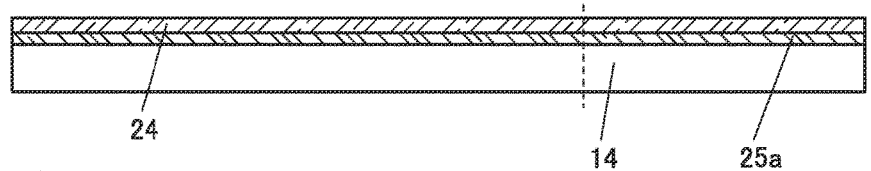
FIGS. 7A to 7E are cross-sectional views illustrating an example of a manufacturing method of a display device.

First, the silicon layer 25a is formed over the formation substrate 14 in a manner similar to that in the manufacturing method example 1 (FIG. 7A).

Next, the first layer 24 is formed in a manner similar to that in the manufacturing method example 1 (FIG. 7A).

Figure 7B:
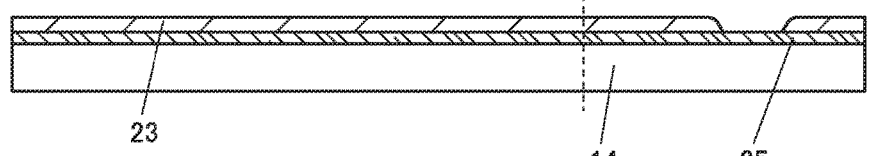

Next, the film processed into a desired shape is heated in a manner similar to that in the manufacturing method example 1, whereby the resin layer 23 is formed (FIG. 7B). FIG. 7B illustrates an example in which the opening that reaches the silicon layer 25a is provided in the resin layer 23.

Figure 7C:
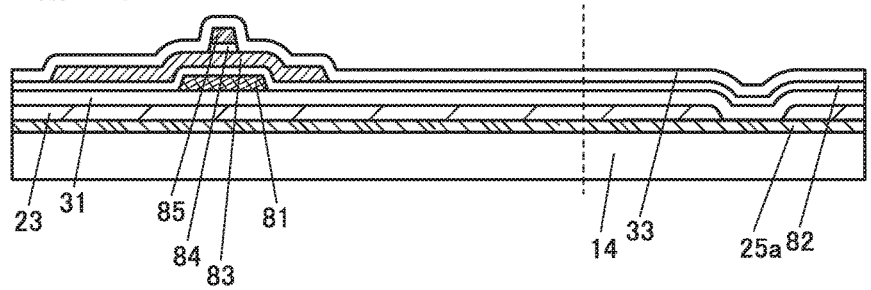

Next, the insulating layer 31 is formed over the resin layer 23 in a manner similar to that in the manufacturing method example 1 (FIG. 7C).

Figure 7D:
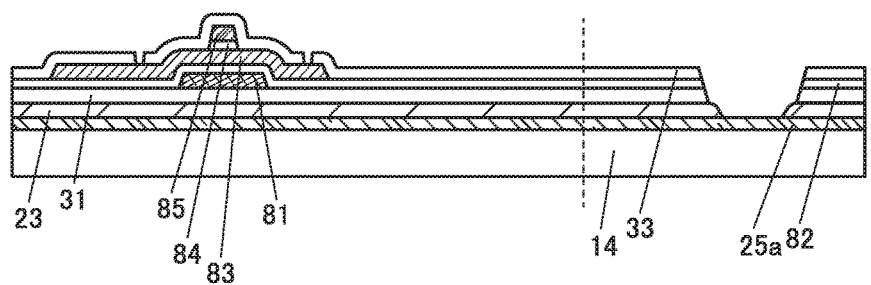
Figure 7E:
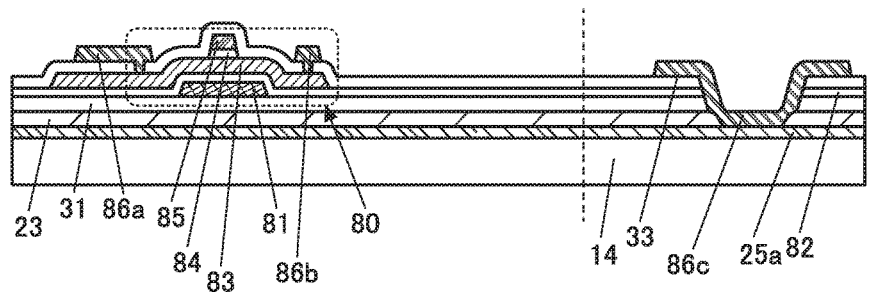

Next, a transistor 80 is formed over the insulating layer 31 (FIGS. 7C to 7E).

Described here is the case where a transistor including a metal oxide layer 83 and two gates is formed as the transistor 80.

The transistor 80 is formed at a temperature lower than or equal to the upper temperature limit of the resin layer 23. The transistor 80 is preferably formed at a temperature lower than or equal to the heating temperature in the above-described post-baking treatment.

Specifically, first, a conductive layer 81 is formed over the insulating layer 31 (FIG. 7C). The conductive layer 81 can be formed in the following manner: a conductive film is formed, a resist mask is formed, the conductive film is etched, and the resist mask is removed.

Next, the insulating layer 82 is formed (FIG. 7C). For the insulating layer 82, the inorganic insulating film that can be used for the insulating layer 31 can be used.

Then, the metal oxide layer 83 is formed (FIG. 7C). The metal oxide layer 83 can be formed in the following manner: a metal oxide film is formed, a resist mask is formed, the metal oxide film is etched, and the resist mask is removed. For the metal oxide layer 83, the description of the material that can be used for the metal oxide layer 44 can be referred to.

Next, the insulating layer 84 and the conductive layer 85 are formed (FIG. 7C). For the insulating layer 84, the inorganic insulating film that can be used for the insulating layer 31 can be used. The insulating layer 84 and the conductive layer 85 can be formed in the following manner: an insulating film to be the insulating layer 84 is formed, a conductive film to be the conductive layer 85 is formed, a resist mask is formed, the insulating film and the conductive film are etched, and the resist mask is removed.

Next, the insulating layer 33 that covers the metal oxide layer 83, the insulating layer 84, and the conductive layer 85 is formed (FIG. 7C). The insulating layer 33 can be formed in a manner similar to that of the insulating layer 31.

Note that the insulating layer 33 preferably contains hydrogen. Hydrogen contained in the insulating layer 33 diffuses into the metal oxide layer 83 that is in contact with the insulating layer 33, so that the resistance of part of the metal oxide layer 83 is reduced. Since part of the metal oxide layer 83 serves as a low-resistance region, the on-state current and the field-effect mobility of the transistor 80 can be increased.

An opening of the insulating layer 31, an opening of the insulating layer 82, and an opening of the insulating layer 33 are provided in a region overlapping with the opening of the resin layer 23 (FIG. 7D). By forming the openings, the silicon layer 25a is exposed. Here, an example in which the openings of the insulating layer 31, the insulating layer 82, and the insulating layer 33 are formed at a time is shown. The openings of the insulating layer 31, the insulating layer 82, and the insulating layer 33 may be formed in separate steps. In addition, the openings may be formed in two or more of the insulating layers at the same time. For example, the opening of the insulating layer 31 may be formed before the conductive layer 81 is formed. For example, the opening may be formed in the insulating layer 82 before the metal oxide layer 83 is formed. For example, the opening of the insulating layer 33 may be provided in the region overlapping with the opening of the resin layer 23 in a step of forming openings that reach the metal oxide layer 83.

Next, a conductive layer 86a, a conductive layer 86b, and a conductive layer 86c are formed (FIG. 7E). The conductive layers 86a, 86b, and 86c can be formed in the following manner: a conductive film is formed, a resist mask is formed, the conductive film is etched, and the resist mask is removed. The conductive layers 86a and 86b are electrically connected to the metal oxide layer 83 through the openings formed in the insulating layer 33. The conductive layer 86c is connected to the silicon layer 25a through the openings provided in the resin layer 23, the insulating layer 31, the insulating layer 82, and the insulating layer 33.

The metal material which can form a metal silicide by reacting with silicon is preferably used as the material for the conductive film to be the conductive layer 86c. For the conductive film, the material that can be used for the conductive film to be the conductive layer 43c can be referred to for the material.

In the above manner, the transistor 80 can be formed (FIG. 7E). In the transistor 80, part of the conductive layer 81 functions as a gate, part of the insulating layer 84 functions as a gate insulating layer, part of the insulating layer 82 functions as a gate insulating layer, and part of the conductive layer 85 functions as a gate. The metal oxide layer 83 includes a channel region and a low-resistance region. The channel region overlaps with the conductive layer 85 with the insulating layer 84 provided therebetween. The low-resistance region includes a region connected to the conductive layer 86a and a region connected to the conductive layer 86b.

Figure 8A:
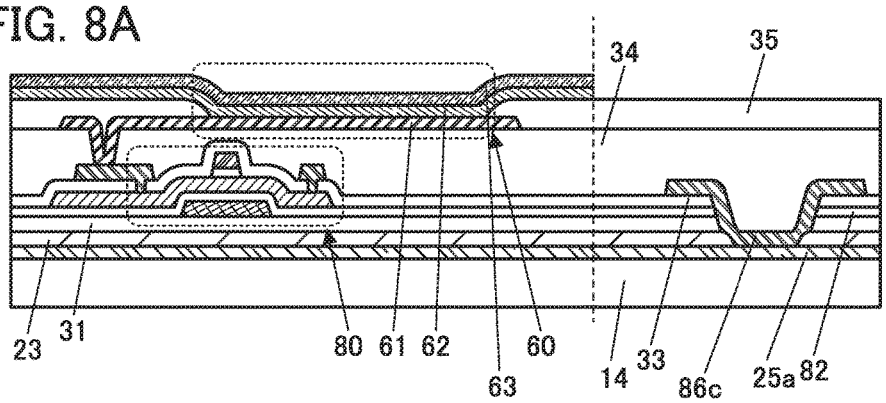
FIGS. 8A to 8C are cross-sectional views illustrating an example of a manufacturing method of a display device.

After that, components from the insulating layer 34 to the display element 60 are formed over the insulating layer 33 (FIG. 8A). For these steps, manufacturing method example 1 can be referred to.

Figure 8B:
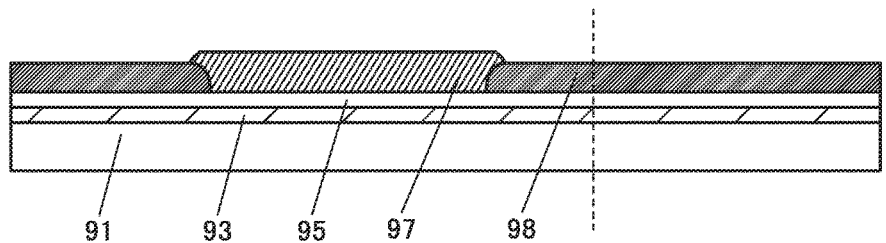

Furthermore, a resin layer 93 serving as a separation layer is formed over a formation substrate 91 (see FIG. 8B).

As a material that can be used for the separation layer, an inorganic material, an organic material, and the like can be given.

Examples of the inorganic material include a metal element selected from tungsten, molybdenum, titanium, tantalum, niobium, nickel, cobalt, zirconium, zinc, ruthenium, rhodium, palladium, osmium, iridium, and silicon; an alloy or a compound that contains any of the above metal elements, and the like.

The material that can be used for the resin layer 23 can be referred to for the organic material.

In this embodiment, an example of using the resin layer 93 for the separation layer is described.

For the resin layer 93, a polyimide resin is preferably used. For a material and a formation method of the resin layer 93, the description of the resin layer 23 is referred to.

The resin layer 93 preferably has a thickness greater than or equal to 0.01 µm and less than 10 µm, further preferably greater than or equal to 0.1 µm and less than or equal to 5 µm, still further preferably greater than or equal to 0.1 µm and less than or equal to 3 µm, and yet still further preferably greater than or equal to 0.5 µm and less than or equal to 1 µm. With a solution having low viscosity, the resin layer 93 having a small thickness can be easily formed. By forming the resin layer 93 thin, the display device can be fabricated at low cost. The display device can be light-weight and thin. The display device can have higher flexibility. The thickness of the resin layer 93 is not limited thereto, and may be greater than or equal to 10 µm. For example, the resin layer 93 may have a thickness greater than or equal to 10 µm and less than or equal to 200 µm. The resin layer 93 having a thickness greater than or equal to 10 µm is favorable because the rigidity of the display device can be increased.

In the case where the resin layer 93 is positioned on the display surface side of the display device, the resin layer 93 preferably has a high visible-light transmitting property.

For the formation substrate 91, the description of the formation substrate 14 can be referred to.

Next, an insulating layer 95 is formed over the resin layer 93. Then, a coloring layer 97 and a light-blocking layer 98 are formed over the insulating layer 95 (FIG. 8B).

For the insulating layer 95, the description of the insulating layer 31 can be referred to.

A color filter or the like can be used as the coloring layer 97. The coloring layer 97 overlaps with the display region of the display element 60.

A black matrix and the like can be used as the light-blocking layer 98. The light-blocking layer 98 overlaps with the insulating layer 35.

Figure 8C:
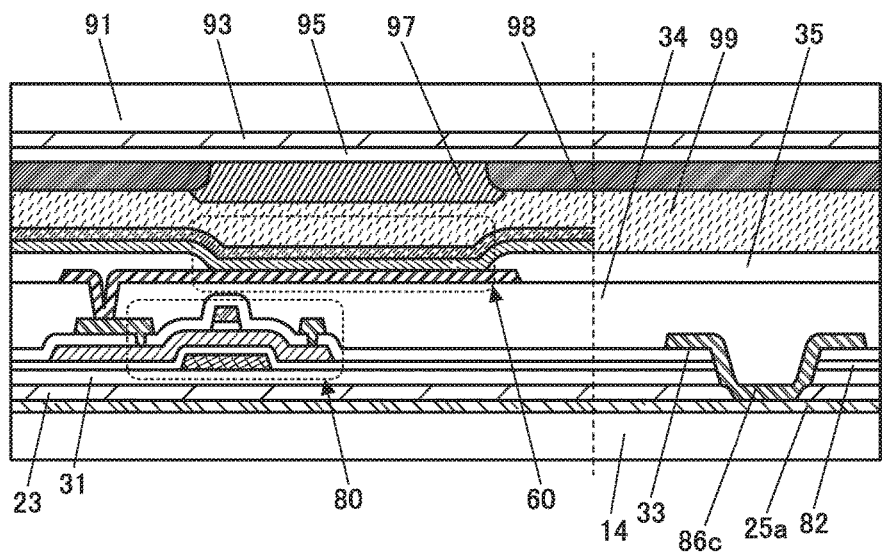

Next, a surface of the formation substrate 14 on which the silicon layer 25a and the like are formed and a surface of the formation substrate 91 on which the resin layer 93 and the like are formed are attached to each other with a bonding layer 99 (FIG. 8C).

Figure 9A:
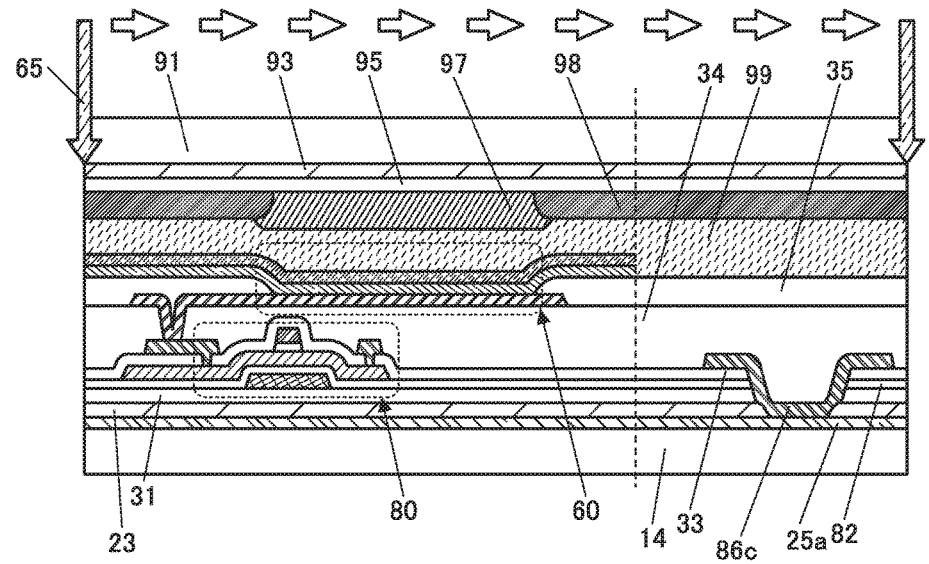
FIGS. 9A and 9B are cross-sectional views illustrating an example of a manufacturing method of a display device.

Next, the resin layer 93 is irradiated with the laser light through the formation substrate 91 (FIG. 9A). Note that either the formation substrate 14 or the formation substrate 91 may be separated first. Here, an example in which the formation substrate 91 is separated ahead of the formation substrate 14 is shown.

Figure 9B:
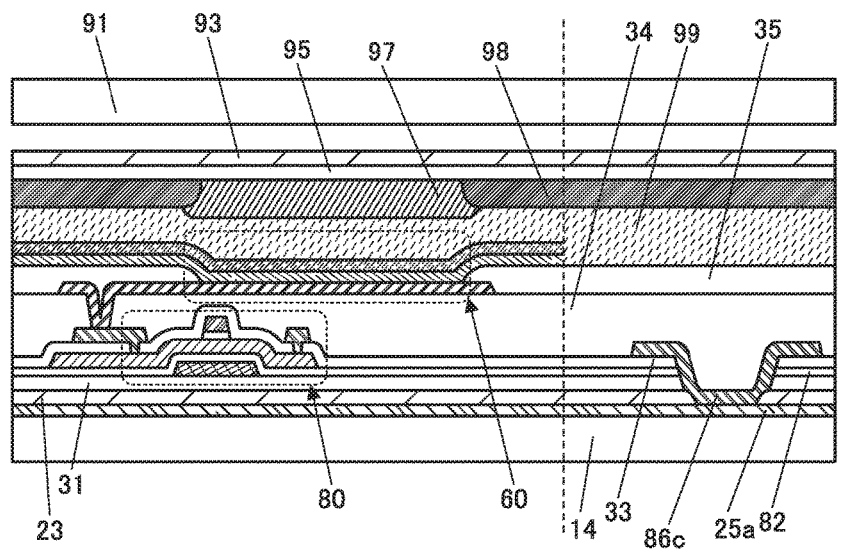

Next, the formation substrate 91 and the insulating layer 95 are separated from each other (FIG. 9B). FIG. 9B illustrates an example where separation occurs at the interface between the formation substrate 91 and the resin layer 93.

Note that separation occurs in the resin layer 93 in some cases. At this time, part of the resin layer remains over the formation substrate 91 and thus the resin layer 93 remaining over the insulating layer 95 side becomes thinner than the resin layer 93 of FIG. 9A.

Figure 10A:
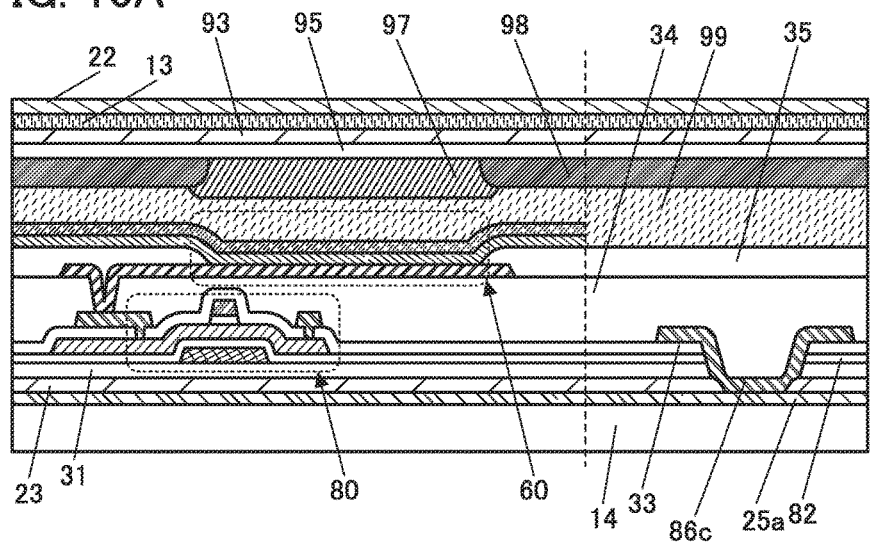
FIGS. 10A and 10B are cross-sectional views illustrating an example of a manufacturing method of a display device.

Then, the exposed resin layer 93 (or insulating layer 95) and the substrate 22 are attached to each other with a bonding layer 13 (FIG. 10A).

In FIG. 10A, the light emitted from the display element 60 is extracted to the outside of the display device through the coloring layer 97 and the resin layer 93. Thus, the transmittance of visible light of the resin layer 93 is preferably high. In the separation method of one embodiment of the present invention, the thickness of the resin layer 93 can be small. Thus, the transmittance of visible light of the resin layer 93 can be high.

In addition, the resin layer 93 may be removed, and the substrate 22 may be attached to the insulating layer 95 with the bonding layer 13. As a method for removing the resin layer 93, ashing or the like can be used.

The bonding layer 13 can be formed using a material for the bonding layer 75b.

The substrate 22 can be formed using a material for the substrate 75a.

Figure 10B:
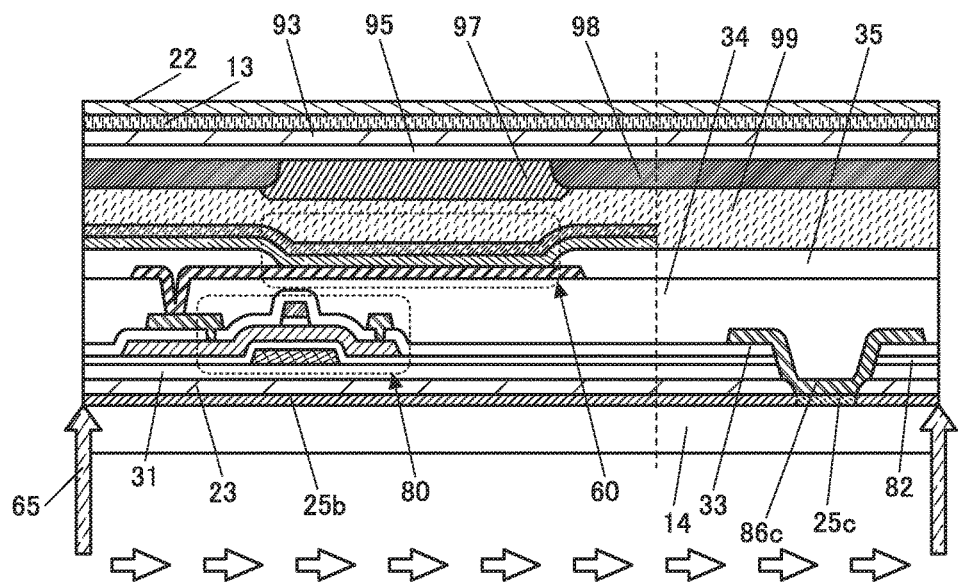

Next, the silicon layer 25a is irradiated with the laser light through the formation substrate 14 (FIG. 10B).

As shown in FIG. 10B, by the irradiation with the laser light 65, amorphous silicon in the silicon layer 25a is crystallized and the silicon layer 25b is formed. The silicon layer 25b contains polysilicon, for example.

Moreover, as shown in FIG. 10B, by the irradiation with the laser light 65, the metal contained in the conductive layer 86c reacts with silicon contained in the silicon layer 25a, so that the metal silicide layer 25c is formed.

By the irradiation with the laser light 65, the silicon layer 25a is heated and releases hydrogen.

Figure 11A:
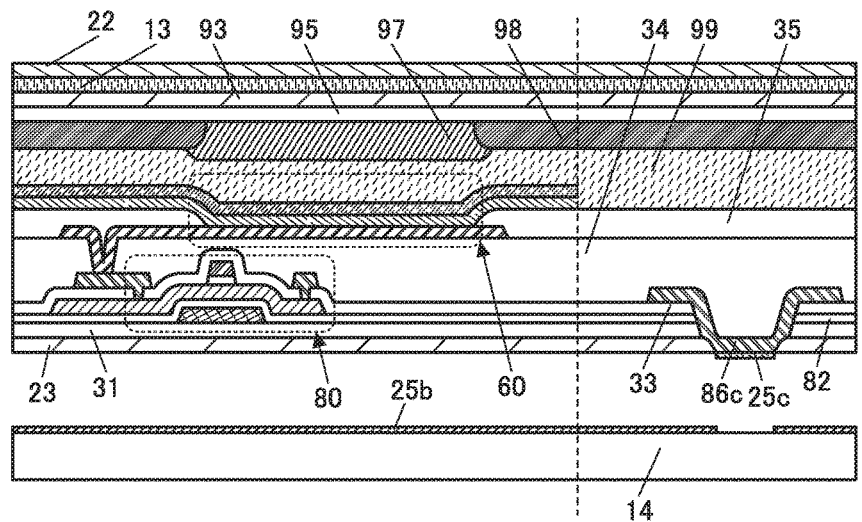
FIGS. 11A and 11B are cross-sectional views illustrating an example of a manufacturing method of a display device.
Figure 11B:
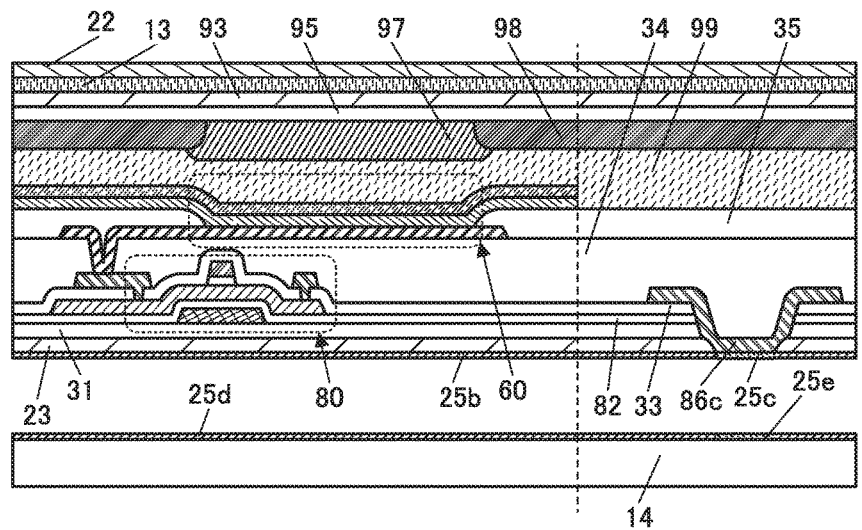

Then, the formation substrate 14 and the insulating layer 31 are separated from each other (FIG. 11A or 11B).

In FIG. 11A, an example where separation occurs at the interface between the silicon layer 25b and the resin layer 23 and the interface between the formation substrate 14 and the metal silicide layer 25c is illustrated. The resin layer 23 and the metal silicide layer 25c are exposed at the separation surface on the transistor 40 side.

FIG. 11B illustrates an example in which separation occurs in the silicon layer 25b and the metal silicide layer 25c. Part of the silicon layer (a silicon layer 25d) and part of the metal silicide layer (a metal silicide layer 25e) remain over the formation substrate 14. The silicon layer 25b and the metal silicide layer 25c that remain on the resin layer 23 and the conductive layer 86c side are thinner than the silicon layer 25b and the metal silicide layer 25c in FIG. 10B.

As shown in FIGS. 11A and 11B, the metal silicide layer 25c connected to the conductive layer 86c is exposed at the separation surface on the transistor 80 side. Thus, the signal or the potential can be supplied from the outside to the conductive layer 86c through the metal silicide layer 25c.

The silicon layer 25b remains on the separation surface on the transistor 80 side in some cases. However, since the silicon layer 25b has lower conductivity than the metal silicide layer 25c, a short circuit is hardly caused between the plurality of conductive layers 86c through the silicon layer 25b. Thus, even when the silicon layer 25b remains on the separation surface on the transistor 80 side, the silicon layer 25b does not need to be removed and an increase in the number of manufacturing steps can be prevented.

Figure 12A:
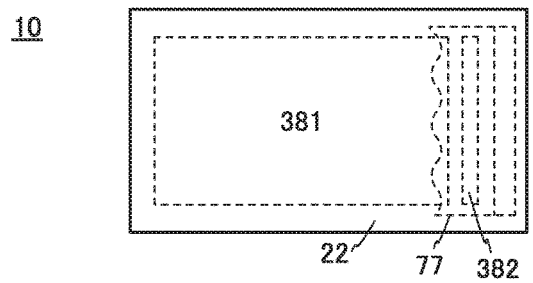
FIGS. 12A and 12B are a top view and a cross-sectional view illustrating an example of a display device.
Figure 12B:
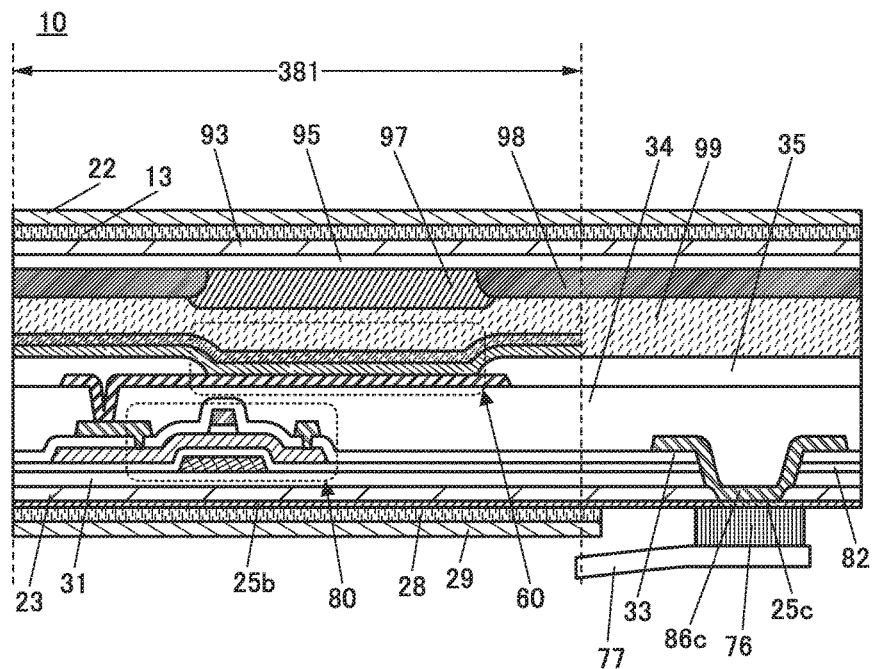

Separation of the formation substrate 14 and the transistor 80 can obtain the display device 10 (FIGS. 12A and 12B). The display device 10 can remain being bent or can be bent repeatedly, for example.

FIG. 12A is a top view of the display device 10. FIG. 12B is a cross-sectional view of a display portion 381 and a portion connected to the FPC 77 of the display device 10. The display device 10 is a top-emission display device using a color filter method.

The display device 10 in FIGS. 12A and 12B includes a pair of substrates (the substrate 22 and the substrate 29). The substrate 22 side functions as a display surface side of the display device. The display device includes the display portion 381 and a driver circuit portion 382. The FPC 77 is attached to the display device.

As illustrated in FIG. 12B, the substrate 29 may be attached to the surface of the resin layer 23 that is exposed by separation, with the bonding layer 28. Note that the substrate 29 and the bonding layer 28 are provided in a position that does not overlap with the conductive layer 86c.

Then, the conductive layer 86c and the FPC 77 are electrically connected to each other through the connector 76 and the metal silicide layer 25c (FIG. 12B).

In this embodiment, an example using a top-emission light-emitting element is shown. In the case where the conductive layer 86c is exposed from the substrate 22 side and electrically connected to the FPC 77, the display region cannot overlap with the FPC 77 because the substrate 22 is on the display surface side, and thus a region of the display device that overlaps with the FPC 77 is limited. According to one embodiment of the present invention, a photosensitive material is used for the resin layer 23 and the metal which forms metal silicide by reacting with silicon is used for the conductive layer 86c, so that the metal silicide layer 25c is exposed from the surface on the opposite side of the display surface. Therefore, the conductive layer 86c and the FPC 77 can be electrically connected to each other through the metal silicide layer 25c. Such a structure allows the FPC 77 to be positioned on the side opposite to the display surface. Thus, a space for bending the FPC 77 in incorporating the display device in an electronic device can be saved, which enables the electronic device to be smaller.

Manufacturing method example 2 is an example where the separation is performed two times by the separation method of one embodiment of the present invention to manufacture a flexible device. In one embodiment of the present invention, each of the functional elements and the like included in the flexible device is formed over the formation substrate; thus, even in the case where a high-resolution display device is manufactured, high alignment accuracy of the flexible substrate is not required. It is thus easy to attach the flexible substrate.

MODIFICATION EXAMPLE 1

Figure 13A:
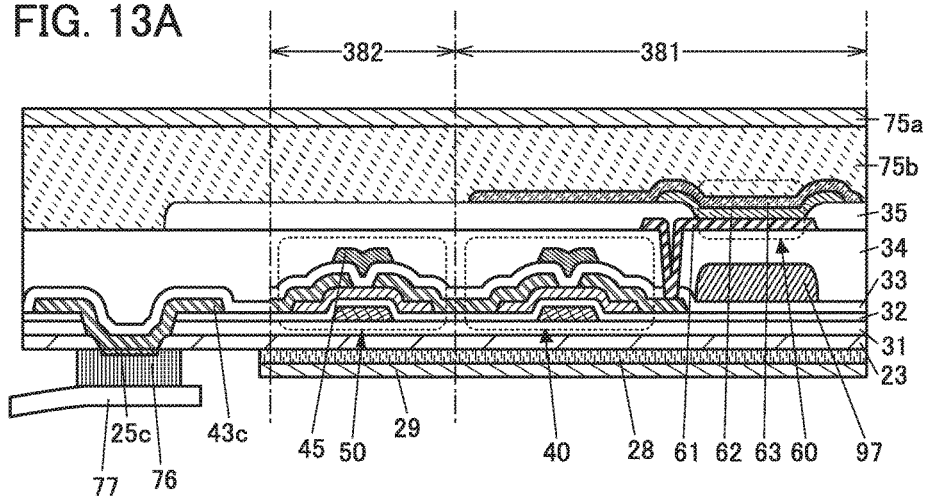
FIGS. 13A and 13B are cross-sectional views illustrating an example of a display device.

The display device in FIG. 13A is a bottom-emission display device using a color filter method. FIG. 13A is a cross-sectional view of the display portion 381 of the display device, a cross-sectional view of the driver circuit portion 382, and a cross-sectional view of a connection portion for connection to the FPC 77.

The display device in FIG. 13A includes the substrate 29, the bonding layer 28, the metal silicide layer 25c, the resin layer 23, the insulating layer 31, the transistor 40, a transistor 50, the conductive layer 43c, the insulating layer 33, the insulating layer 34, the insulating layer 35, the display element 60, the bonding layer 75b, the substrate 75a, and the coloring layer 97.

In FIG. 13A, the transistor 40 and the transistor 50 include a conductive layer 45 functioning as a gate, in addition to the components of the transistor 40 shown in FIG. 6A.

The display element 60 emits light to the coloring layer 97 side.

The FPC 77 and the conductive layer 43c are electrically connected to each other through the metal silicide layer 25c and the connector 76. In this example, the end portion of the insulating layer 35 is not exposed at the end portion of the display device in the cross-sectional view of a connection portion for connection to the FPC 77. The resin layer 23 includes a portion that is not in contact with the island-shaped metal silicide layer 25c.

MODIFICATION EXAMPLE 2

Figure 13B:
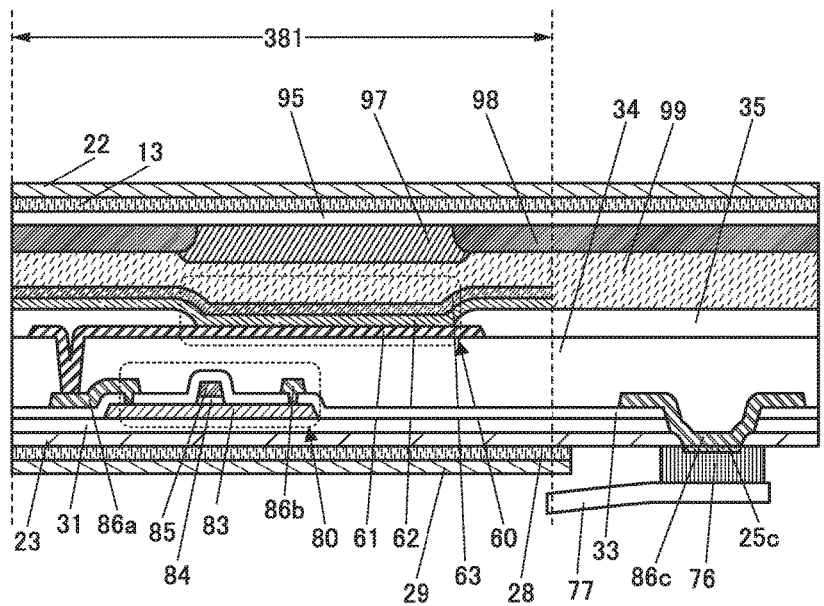

The display device in FIG. 13B is different from the display device in FIG. 12B in that the conductive layer 81 and the insulating layer 82 are not provided in the transistor 80.

Furthermore, the display device in FIG. 13B is different from the display device in FIG. 12B in that the resin layer 23 includes a portion that is not in contact with the island-shaped metal silicide layer 25c. The display device shown in FIG. 13B includes the island-shaped metal silicide layer 25c which is in contact with the conductive layer 86c.

As described above, in one embodiment of the present invention, a flexible device can be manufactured by separating the transistor or the like from the formation substrate using the silicon layer.

In one embodiment of the present invention, the resin layer is formed using the photosensitive material; thus, the resin layer with a desired shape can be easily formed. Furthermore, in the separation step in one embodiment of the present invention, the silicon layer is irradiated with light, so that the metal silicide layer is formed in the region overlapping with the opening of the resin layer. Then, the metal silicide layer is exposed at the separation surface and the signal or the potential is supplied from the outside to the conductive layer through the metal silicide layer. Thus, the external connection terminal and the circuit board can be electrically connected to each other on the surface opposite to the display surface. Thus, a space for bending the FPC and the like in incorporating the display device in an electronic device can be saved, which enables the electronic device to be smaller.

According to one embodiment of the present invention, by using a metal oxide for a channel formation region of the transistor, the manufacturing process of the transistor can be performed at low temperature. Furthermore, the resin layer can have a small thickness and low heat resistance. Thus, the material of the resin layer can be selected from a wide range, high mass productivity can be obtained at low cost, and a large substrate can be used, for example.

This embodiment can be combined with any of other embodiments as appropriate. In the case where a plurality of structure examples are described in one embodiment in this specification, some of the structure examples can be combined as appropriate.

Embodiment 2

In this embodiment, a display module and electronic devices that can be fabricated using one embodiment of the present invention will be described with reference to FIGS. 14A to 14F.

According to one embodiment of the present invention, highly reliable electronic devices having curved surfaces can be manufactured. According to one embodiment of the present invention, flexible and highly reliable electronic devices can be manufactured.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device of one embodiment of the present invention can be incorporated along a curved inside/outside wall surface of a house or a building or a curved interior/exterior surface of a car.

The electronic device of one embodiment of the present invention may include a secondary battery. Preferably, the secondary battery is capable of being charged by contactless power transmission.

Examples of the secondary battery include a lithium ion secondary battery such as a lithium polymer battery (lithium ion polymer battery) using a gel electrolyte, a nickel-hydride battery, a nickel-cadmium battery, an organic radical battery, a lead storage battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

Figure 14A:
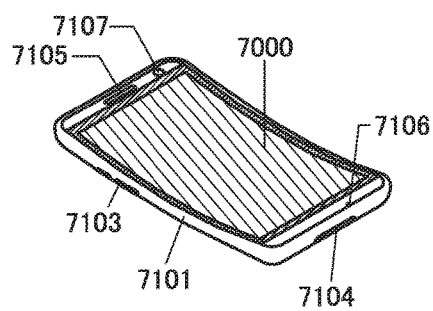
FIGS. 14A to 14F are perspective views each illustrating an example of an electronic device.
Figure 14B:
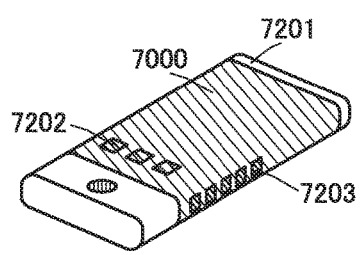
Figure 14C:
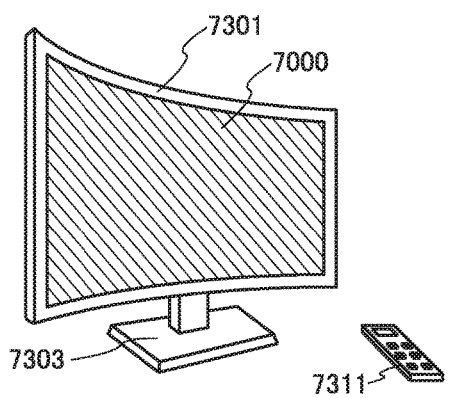

FIGS. 14A to 14C illustrate examples of an electronic device including a curved display portion 7000. The display surface of the display portion 7000 is bent, and images can be displayed on the bent display surface. Note that the display portion 7000 may have flexibility.

The display portion 7000 can be formed using the display device of one embodiment of the present invention. One embodiment of the present invention makes it possible to provide a highly reliable electronic device having a curved display portion.

FIG. 14A illustrates an example of a mobile phone. A mobile phone 7110 illustrated in FIG. 14A include a housing 7101, the display portion 7000, an operation button 7103, an external connection port 7104, a speaker 7105, a microphone 7106, a camera 7107, and the like.

The mobile phone 7110 includes a touch sensor in the display portion 7000. Operations such as making a call and inputting a letter can be performed by touch on the display portion 7000 with a finger, a stylus, or the like.

With the operation button 7103, power ON or OFF can be switched. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

FIG. 14B illustrates an example of a portable information terminal. A portable information terminal 7210 illustrated in FIG. 14B includes a housing 7201 and the display portion 7000. The portable information terminal 7210 may also include operation buttons, an external connection port, a speaker, a microphone, an antenna, a camera, a battery, or the like. The display portion 7000 is provided with the touch sensor. An operation of the portable information terminal can be performed by touching the display portion 7000 with a finger, a stylus, or the like.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminal 7210 can display characters, image information, and the like on its plurality of surfaces. For example, three operation buttons 7202 can be displayed on one surface, and information 7203 indicated by a rectangle can be displayed on another surface. FIG. 14B illustrates an example in which the operation buttons 7202 are displayed on the top surface of the portable information terminal 7210 and the information 7203 is displayed on the side surface of the portable information terminal 7210. Note that the operation buttons 7202 may be displayed on the side surface of the portable information terminal 7210 and the information 7203 may be displayed on the top surface of the portable information terminal 7210, for example. Information may be displayed on three or more surfaces of the portable information terminal 7210.

Examples of the information 7203 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information 7203.

FIG. 14C illustrates an example of a television set. In a television set 7300, the display portion 7000 is incorporated into a housing 7301. Here, the housing 7301 is supported by a stand 7303.

The television set 7300 illustrated in FIG. 14C can be operated with an operation switch of the housing 7301 or a separate remote controller 7311. The display portion 7000 may include a touch sensor, and the television set 7300 can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 14D:
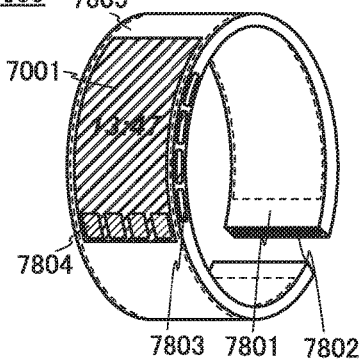
Figure 14E:
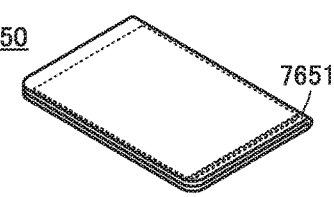
Figure 14F:
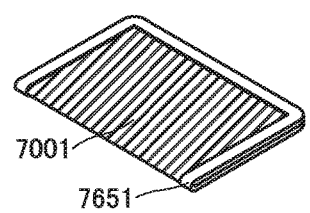

FIGS. 14D to 14F illustrate examples of portable information terminals each including a flexible and bendable display portion 7001.

The display portion 7001 is manufactured using the display device or the like of one embodiment of the present invention. For example, a display device or the like that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

FIG. 14D illustrates an example of a wrist-watch-type portable information terminal. The portable information terminal 7800 includes a band 7801, the display portion 7001, an input/output terminal 7802, operation buttons 7803, and the like. The band 7801 has a function as a housing. A flexible battery 7805 can be included in the portable information terminal 7800. The battery 7805 may be arranged to overlap with the display portion 7001, the band 7801, or the like, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

FIGS. 14E and 14F illustrate an example of a foldable portable information terminal. FIG. 14E illustrates a portable information terminal 7650 that is folded so that the display portion 7001 is on the inside. FIG. 14F illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged. Note that FIGS. 14E and 14F each illustrate a structure in which the portable information terminal 7650 is folded in two; however, the portable information terminal 7650 may be folded in three or four or more. The portable information terminal 7650 may also include an operation button, an external connection port, a speaker, a microphone, an antenna, a camera, a battery, or the like.

This embodiment can be combined with any of other embodiments as appropriate.

This application is based on Japanese Patent Application Serial No. 2017-003050 filed with Japan Patent Office on Jan. 12, 2017, the entire contents of which are hereby incorporated by reference.

What is claimed is:

1. A manufacturing method of a semiconductor device, comprising the steps of:
    forming a silicon layer over a substrate;
    forming a resin layer over the silicon layer;
    forming a transistor over the resin layer;
    forming a conductive layer over the silicon layer and the resin layer; and
    separating the substrate and the transistor from each other,
    wherein the resin layer comprises an opening over the silicon layer,
    wherein the conductive layer is in contact with the silicon layer through the opening of the resin layer, and
    wherein in the step of separating the substrate and the transistor from each other, silicon contained in the silicon layer and metal contained in the conductive layer react with each other by irradiation of the silicon layer with light to form a metal silicide layer.

2. The manufacturing method of the semiconductor device according to claim 1, wherein the conductive layer comprises one or more of nickel, cobalt, molybdenum, titanium, tungsten, vanadium, niobium, rhenium, palladium, platinum, erbium, and magnesium.

3. The manufacturing method of the semiconductor device according to claim 1, wherein the conductive layer is formed using the same material and the same step as a material and a step used for an electrode included in the transistor.

4. The manufacturing method of the semiconductor device according to claim 1, wherein the light has a wavelength range of greater than or equal to 180 nm and less than or equal to 450 nm.

5. The manufacturing method of the semiconductor device according to claim 1,
    wherein the silicon layer comprises hydrogen, and
    wherein the silicon layer releases the hydrogen by being irradiated with the light in the step of separating the substrate and the transistor from each other.

6. The manufacturing method of the semiconductor device according to claim 1, wherein a hydrogenated amorphous silicon layer is formed as the silicon layer.

7. The manufacturing method of the semiconductor device according to claim 1, wherein the silicon layer is irradiated with the light with a linear laser.

8. The manufacturing method of the semiconductor device according to claim 1, wherein the resin layer has a thickness of greater than or equal to 0.1 μm and less than or equal to 5 μm.

9. The manufacturing method of the semiconductor device according to claim 1, wherein the silicon layer is irradiated with the light from the substrate side.

10. The manufacturing method of the semiconductor device according to claim 1, wherein the transistor comprises a metal oxide in a channel formation region.

11. The manufacturing method of the semiconductor device according to claim 1,
    wherein the metal silicide layer is exposed in the step of separating the substrate and the transistor from each other, and
    wherein the exposed metal silicide layer and a circuit board are electrically connected to each other after the step of separating the substrate and the transistor from each other.

\* \* \* \* \*